United States Patent
Asai et al.

(10) Patent No.: US 8,679,931 B2
(45) Date of Patent: Mar. 25, 2014

(54) DICING TAPE-INTEGRATED FILM FOR SEMICONDUCTOR BACK SURFACE, AND PROCESS FOR PRODUCING SEMICONDUCTOR DEVICE

(75) Inventors: Fumiteru Asai, Osaka (JP); Goji Shiga, Osaka (JP); Naohide Takamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 14 days.

(21) Appl. No.: 13/191,697

(22) Filed: Jul. 27, 2011

(65) Prior Publication Data
US 2012/0028418 A1 Feb. 2, 2012

(30) Foreign Application Priority Data

Jul. 29, 2010 (JP) ................................. 2010-170920

(51) Int. Cl.
H01L 21/00 (2006.01)
H01L 21/331 (2006.01)

(52) U.S. Cl.
USPC ........................ 438/354; 438/108; 438/114

(58) Field of Classification Search
USPC .................................. 438/108, 114; 428/354
See application file for complete search history.

(56) References Cited

U.S. PATENT DOCUMENTS

| | | | | |
|---|---|---|---|---|
| 5,476,566 | A * | 12/1995 | Cavasin | 156/249 |
| 6,444,310 | B1 * | 9/2002 | Senoo et al. | 428/354 |
| 7,101,620 | B1 * | 9/2006 | Poddar et al. | 428/354 |
| 8,309,219 | B2 * | 11/2012 | Hwang et al. | 428/354 |
| 2004/0213994 | A1 * | 10/2004 | Kozakai et al. | 428/354 |
| 2005/0139973 | A1 | 6/2005 | Matsumura et al. | |
| 2006/0220221 | A1 * | 10/2006 | Shimanuki | 257/700 |
| 2007/0066044 | A1 * | 3/2007 | Abe et al. | 438/612 |
| 2008/0088036 | A1 | 4/2008 | Matsumura et al. | |
| 2010/0219507 | A1 | 9/2010 | Misumi et al. | |
| 2010/0330780 | A1 | 12/2010 | Hwang et al. | |

FOREIGN PATENT DOCUMENTS

| | | |
|---|---|---|
| CN | 1638092 A | 7/2005 |
| CN | 101385135 A | 3/2009 |
| JP | 2007-266420 | 10/2007 |
| JP | 2008-006386 A | 1/2008 |
| JP | 2008-166451 A | 7/2008 |
| WO | 2008/047610 A1 | 4/2008 |
| WO | 2009/113831 A2 | 9/2009 |

OTHER PUBLICATIONS

Office Action, dated Nov. 4, 2013, issued by the State Intellectual Property Office of the People's Republic of China, in counterpart Application No. 201110216966.5.
Japanese Patent Office, Notification of Reasons for Refusal issued on Dec. 25, 2013 in a counterpart Japanese Application No. 2010-170920.

* cited by examiner

*Primary Examiner* — Fernando L Toledo
*Assistant Examiner* — Karen Kusumakar
(74) *Attorney, Agent, or Firm* — Sughrue Mion, PLLC

(57) ABSTRACT

The present invention relates to a dicing tape-integrated film for semiconductor back surface, which includes: a dicing tape including a base material layer, a first pressure-sensitive adhesive layer and a second pressure-sensitive adhesive layer stacked in this order, and a film for semiconductor back surface stacked on the second pressure-sensitive adhesive layer of the dicing tape, in which a peel strength Y between the first pressure-sensitive adhesive layer and the second pressure-sensitive adhesive layer is larger than a peel strength X between the second pressure-sensitive adhesive layer and the film for semiconductor back surface, and in which the peel strength X is from 0.01 to 0.2 N/20 mm, and the peel strength Y is from 0.2 to 10 N/20 mm.

8 Claims, 2 Drawing Sheets

DICING TAPE-INTEGRATED FILM FOR SEMICONDUCTOR BACK SURFACE, AND PROCESS FOR PRODUCING SEMICONDUCTOR DEVICE

FIELD OF THE INVENTION

The present invention relates to a dicing tape-integrated film for semiconductor back surface and to a process for producing a semiconductor device. The film for semiconductor back surface is used for protecting the back surface of a semiconductor element such as a semiconductor chip and for enhancing the strength thereof.

BACKGROUND OF THE INVENTION

Recently, thinning and miniaturization of a semiconductor device and its package have been increasingly demanded. Therefore, as the semiconductor device and its package, flip chip type semiconductor devices in which a semiconductor element such as a semiconductor chip is mounted (flip chip-connected) on a substrate by means of flip chip bonding have been widely utilized. In such flip chip connection, a semiconductor chip is fixed to a substrate in a form where a circuit face of the semiconductor chip is opposed to an electrode-formed face of the substrate. In such a semiconductor device or the like, there may be a case where the back surface of the semiconductor chip is protected with a protective film to prevent the semiconductor chip from damaging or the like (see, Patent Document 1 to 2).

However, for protecting the back surface of a semiconductor chip with the protective film above, a step of attaching the protective film to the back surface of a semiconductor chip obtained in a dicing step must be newly added. As a result, the number of steps is increased, and this brings about a rise in the production cost or the like.

Patent Document 1: JP-A-2008-166451
Patent Document 2: JP-A-2008-006386

The present inventors have developed a dicing tape-integrated film for semiconductor back surface with an attempt to reduce the production cost and filed a patent application thereon (which has not been laid open to public inspection at the time of filing of the present invention). Such a dicing tape-integrated film for semiconductor back surface is required to ensure good adherent force of the film for semiconductor back surface to a semiconductor wafer in the dicing step. On the other hand, the dicing tape supporting the film for semiconductor back surface is required to satisfy good holding force on a ring frame, adherence to the film for semiconductor back surface so as to prevent scattering of semiconductor chips individualized by dicing, and low contamination by keeping the cutting debris generated during dicing from attaching to a semiconductor chip having the film for semiconductor back surface attached thereto.

Furthermore, also in a picking-up step that is the next step of the dicing step, the dicing tape supporting the film for semiconductor back surface is required to allow no generation of cracking, breakage, plastic deformation or the like of the base material even at the extension in the picking-up step and also exhibit good releasability enabling the semiconductor chip after dicing to be separated together with the film for semiconductor back surface from the dicing tape.

However, it has been never easy to bring out these characteristics in a balanced manner. In particular, the semiconductor chip is recently reduced in the thickness and increased in the area for the purpose of achieving high capacity, and it is very difficult for the dicing tape to satisfy various requirements. That is, the dicing tape can hardly respond to individual functions corresponding to various required characteristics and in turn, the characteristics required cannot be exerted in a balanced manner.

SUMMARY OF THE INVENTION

An object of the present invention is to provide a dicing tape-integrated film for semiconductor back surface, ensuring that even when the semiconductor wafer is thin, an excellent balance is achieved among holding force during dicing of the thin workpiece, releasability when allowing the semiconductor chip obtained by dicing to be separated together with the film for semiconductor back surface, and low contamination free from attachment of the cutting debris to the separated semiconductor chip with the film for semiconductor back surface and, in addition, the device chip can be prevented from contamination due to peeling of the film for semiconductor back surface during dicing; as well as a method for manufacturing a semiconductor device by using the same.

As a result of intensive studies to solve the above-described problems, the present inventors have found that when the following configuration is employed, a dicing tape-integrated film for semiconductor back surface, which combines holding force and low contamination at the dicing with easy releasability at the picking up in a balanced manner, can be provided. The present invention has been accomplished based on this finding.

Namely, the present invention provides a dicing tape-integrated film for semiconductor back surface (hereinafter may be referred to as "integrated tape"), comprising: a dicing tape comprising a base material layer, a first pressure-sensitive adhesive layer and a second pressure-sensitive adhesive layer stacked in this order, and a film for semiconductor back surface stacked on the second pressure-sensitive adhesive layer of the dicing tape, wherein a peel strength Y between the first pressure-sensitive adhesive layer and the second pressure-sensitive adhesive layer is larger than a peel strength X between the second pressure-sensitive adhesive layer and the film for semiconductor back surface, and wherein the peel strength X is from 0.01 to 0.2 N/20 mm, and the peel strength Y is from 0.2 to 10 N/20 mm.

In the integrated film above, a two-layer structure including layers differing in the pressure-sensitive adhesive force is employed as the pressure-sensitive adhesive layer, the peel strength Y between the first pressure-sensitive adhesive layer and the second pressure-sensitive adhesive is larger than the peel strength X between the second pressure-sensitive adhesive layer and the film for semiconductor back surface, and the peel strengths X and Y are set to predetermined ranges. Here, if a single layer that is a layer having large peel strength is employed as the pressure-sensitive adhesive layer, the holding force for the semiconductor wafer at the dicing is sufficient, but the peel strength between the pressure-sensitive adhesive layer and the film for semiconductor back surface becomes excessively high to thereby deteriorate the picking-up property. On the other hand, if a single layer that is a layer having small peel strength is employed as the pressure-sensitive adhesive layer, the picking-up property is good but the holding force for the semiconductor wafer at the dicing is reduced, and this may allow for chip flying, separation (peeling) of the film for semiconductor back surface from the pressure-sensitive adhesive layer, excessive friction or vibration between the peeled portion and a blade, and contamination of the semiconductor chip due to the excessive friction or vibration. In the integrated film above, the peel strengths of respective layers are stepwise set to let the peel strength Y between the first pressure-sensitive adhesive layer and the second pressure-sensitive adhesive layer be larger than the peel strength X between the second pressure-sensitive adhesive layer and the film for semiconductor back surface, so that the holding force and anticontamination at the dicing and the easy releasability at the picking up can be exerted in a balanced manner.

Also, in the integrated film above, the peel strength X is set to be from 0.01 to 0.2 N/20 mm, so that not only the holding force at the dicing can be sufficiently ensured but also no peeling of the film for semiconductor back surface during dicing is allowed, making it possible to efficiently prevent contamination of the semiconductor chip, and at the same time, easy releasability at the picking up can be enhanced.

Furthermore, in the integrated film above, the peel strength Y is set to be from 0.2 to 10 N/20 mm, so that the adherence to a dicing ring at the dicing can be enhanced, and not only the holding force for the semiconductor wafer can be sufficiently ensured but also the pressure-sensitive adhesive of the second pressure-sensitive adhesive layer can be prevented from transferring (adhesive residue) to the film for semiconductor back surface due to separation between the first pressure-sensitive adhesive layer and the second pressure-sensitive adhesive layer.

The ratio (Y/X) of the peel strength Y to the peel strength X is preferably from 3 to 500. When this ratio is from 3 to 500, the peel strength Y and the peel strength X can become at the similar degree. Therefore, it is possible to prevent separation not only between the second pressure-sensitive adhesive layer and the film for semiconductor back surface but also between the first pressure-sensitive adhesive layer and the second pressure-sensitive adhesive layer, which would cause adhesive residue or the like from the second pressure-sensitive adhesive layer to the film for semiconductor back surface. In addition, peeling of the film for semiconductor back surface can be prevented from occurring during dicing due to relatively too small peel strength X and incurring contamination of the semiconductor chip.

It is preferable that the thickness of the first pressure-sensitive adhesive layer is 10 μm or more. In this case, the close adhesion of the first pressure-sensitive adhesive layer to a ring frame can be enhanced.

The second pressure-sensitive adhesive layer is preferably formed of an ultraviolet-curable pressure-sensitive adhesive. Owing to such a configuration, the relationship of the peel strengths X and Y specified in the present invention can be specifically and easily achieved.

The present invention also provides a method for producing a semiconductor device using the above-mentioned dicing tape-integrated film for semiconductor back surface, the method comprising: attaching a semiconductor wafer onto the film for semiconductor back surface in the dicing tape-integrated film for semiconductor back surface, dicing the semiconductor wafer to form a semiconductor chip, separating the semiconductor chip together with the film for semiconductor back surface from the pressure-sensitive adhesive layer of the dicing tape, and flip chip-connecting the semiconductor chip onto an adherend.

In the method above, the dicing tape-integrated film for semiconductor back surface is attached to the back surface of a semiconductor wafer and therefore, a step of attaching only a film for semiconductor back surface (attaching step of a film for semiconductor back surface) is not required. Also, during dicing of a semiconductor wafer or picking up of a semiconductor chip formed by the dicing, the back surface of the semiconductor wafer or the semiconductor chip is protected with the film for semiconductor back surface and therefore, can be prevented from damage or the like. Furthermore, thanks to use of the integrated film, the dicing step and the picking-up step can be easily and efficiently performed. In turn, a flip-chip semiconductor device can be produced at enhanced production yield.

According to the dicing tape-integrated film for semiconductor back surface of the invention, a dicing tape and a film for flip-chip semiconductor back surface are integrally formed, so that the integrated film can be used also in the dicing step of dicing a semiconductor wafer to produce a semiconductor element and the subsequent picking-up step. As a result, the step of attaching only a film for semiconductor back surface (attaching step of a film for semiconductor back surface) is not required. Furthermore, the pressure-sensitive adhesive layer is configured as a two-layer structure including layers differing in the pressure-sensitive adhesive force, and each of the peel strength between the film for semiconductor back surface and the second pressure-sensitive adhesive layer and the peel strength between the first pressure-sensitive adhesive layer and the second pressure-sensitive adhesive layer is set to a predetermined relationship, so that enhanced holding force for the semiconductor wafer and low contamination of the semiconductor chip in the subsequent dicing step as well as easy releasability in the picking-up step can be achieved and at the same time, these two steps can be simply and efficiently performed. In addition, the film for semiconductor back surface is attached to the back surface of a semiconductor wafer or the back surface of a semiconductor element formed by the dicing, so that the semiconductor wafer or semiconductor element can be effectively protected and damages of the semiconductor element can be suppressed or prevented. Also, after bonding of the semiconductor element to a substrate or the like, the film for semiconductor back surface not only exerts a function of protecting the back surface of the semiconductor element but also exhibits a good laser marking property and can enhance discrimination of the semiconductor element or the like.

According to the production method of a semiconductor device of the present invention, since the integrated film above is used, the holding force for a semiconductor wafer in the dicing step can be sufficiently exerted and contamination of a semiconductor chip due to peeling of the film for semiconductor surface can be prevented. Also, at the picking up, integrated separation of the semiconductor chip and the film for semiconductor back surface can be easily performed and at the same time, adhesive residue (adhesive transfer) from the second pressure-sensitive adhesive layer to the film for semiconductor back surface can be prevented. In this way, according to the production method of the present invention, contradictory functions required in the dicing step and the picking-up step, which had been conventionally difficult to fulfill, can be well-balanced and a semiconductor device can be efficiently produced. Furthermore, the dicing tape-integrated film for semiconductor back surface is attached to the back surface of a semiconductor wafer and therefor, a step of attaching only a film for semiconductor back surface is not required. In addition, during dicing of a semiconductor wafer or picking up of a semiconductor chip formed by the dicing, the back surface of the semiconductor wafer or semiconductor chip is protected with the film for semiconductor back surface and therefore, can be prevented from damage or the like. For these reasons, a flip-chip semiconductor device can be efficiently produced with good laser masking property and good adhesion to a semiconductor wafer while enhancing the production yield.

Figure 1:
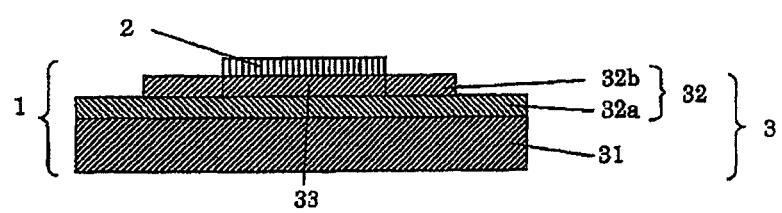
FIG. 1 is a cross-sectional schematic view showing one embodiment of a dicing tape-integrated film for semiconductor back surface of the invention.

| Description of Reference Numerals and Signs | |
|---|---|
| 1 | Dicing Tape-Integrated Film for Semiconductor Back Surface |
| 2 | Film for Semiconductor Back Surface |
| 3 | Dicing Tape |
| 31 | Base Material |
| 32 | Pressure-Sensitive Adhesive Layer |
| 32a | First Pressure-Sensitive Adhesive Layer |
| 32b | Second Pressure-Sensitive Adhesive Layer |
| 33 | Part Corresponding to Semiconductor Wafer-Attaching Part |
| 4 | Semiconductor Wafer |
| 5 | Semiconductor Chip |
| 51 | Bump Formed on the Circuit Face Side of Semiconductor Chip 5 |
| 6 | Adherend |
| 61 | Conductive Material for Conjunction Attached to Connection Pad of Adherend 6 |

BEST MODE FOR CARRYING OUT THE INVENTION

Embodiments of the present invention are described with reference to FIG. 1 but the invention is not restricted to these embodiments. FIG. 1 is a cross-sectional schematic view showing one embodiment of a dicing tape-integrated film for semiconductor back surface according to the present embodiment. Incidentally, in the figures in the present specification, parts that are unnecessary for the description are not given, and there are parts shown by magnifying, minifying, etc. in order to make the description easy.

(Dicing Tape-Integrated Film for Semiconductor Back Surface)

As shown in FIG. 1, the dicing tape-integrated film 1 for semiconductor back surface (hereinafter sometimes also referred to as "integrated film", "dicing tape-integrated semiconductor back surface protective film", "film for semiconductor back surface with dicing tape", or "semiconductor back surface protective film with dicing tape") comprises a dicing tape 3 including a pressure-sensitive adhesive layer 32 on a base material 31, and a film 2 for semiconductor back surface (hereinafter sometimes referred to as "semiconductor back surface protective film") provided on the pressure-sensitive adhesive layer. The pressure-sensitive adhesive layer 32 includes a first pressure-sensitive adhesive layer 32a and a second pressure-sensitive adhesive layer 32b from the base material 31 side (hereinafter, the first pressure-sensitive adhesive layer and the second pressure-sensitive adhesive layer are sometimes collectively referred to as a pressure-sensitive adhesive layer).

Also, the dicing tape-integrated film for semiconductor back surface of the present invention may have a configuration where, as shown in FIG. 1, the second pressure-sensitive adhesive layer 32b is formed in a portion larger than a portion 33 corresponding to the attaching portion of the film 2 for semiconductor back surface and smaller than the entire surface of the first pressure-sensitive adhesive layer 32a on the pressure-sensitive adhesive layer 32 of the dicing tape 3, may have a configuration where the second pressure-sensitive adhesive layer 32b is formed only in the portion 33 corresponding to the attaching portion of the film 2 for semiconductor back surface, or may have a configuration where the second pressure-sensitive adhesive layer 32b is formed over the entire surface of the first pressure-sensitive adhesive layer 32a. Incidentally, the surface (the surface on the side attached to the back surface of a wafer) of the film 2 for semiconductor back surface may be protected with a separator or the like until the film is attached to the wafer back surface.

In the integrated film 1 of the present invention, the pressure-sensitive adhesive layer 32 is formed as a two-layer structure including a first pressure-sensitive adhesive layer 32a and a second pressure-sensitive adhesive layer 32b and the peel strength Y between the first pressure-sensitive adhesive layer 32a and the second pressure-sensitive adhesive layer 32b is set to be larger than the peel strength X between the second pressure-sensitive adhesive layer 32b and the film 2 for semiconductor back surface. If a single layer that is a layer having large peel strength is employed as the pressure-sensitive adhesive layer, the holding force for the semiconductor wafer at the dicing is sufficient, but the peel strength between the pressure-sensitive adhesive layer and the film for semiconductor back surface becomes excessively high to thereby deteriorate the picking-up property. On the other hand, if a single layer that is a layer having small peel strength is employed as the pressure-sensitive adhesive layer, the picking-up property is good but the holding force for the semiconductor wafer at the dicing is reduced, and this may allow for chip flying, separation (peeling) of the film for semiconductor back surface from the pressure-sensitive adhesive layer, excessive friction or vibration between the peeled portion and a blade, and contamination of the semiconductor chip due to the excessive friction or vibration. In the integrated film above, the peel strengths of respective layers are stepwise set to let the peel strength Y between the first pressure-sensitive adhesive layer 32a and the second pressure-sensitive adhesive layer 32b be larger than the peel strength X between the second pressure-sensitive adhesive layer 32b and the film 2 for semiconductor back surface, so that the holding force and anticontamination at the dicing as well as the easy releasability at the picking up can be exerted in a balanced manner.

The peel strength X is from 0.01 to 0.2 N/20 mm, preferably from 0.02 to 0.18 N/20 mm, more preferably from 0.04 to 0.15 N/20 mm. With the peel strength X in this range, not only the holding force at the dicing can be sufficiently ensured but also no peeling of the film for semiconductor back surface during dicing is allowed, making it possible to efficiently prevent contamination of the semiconductor chip, and at the same time, easy releasability at the picking up can be enhanced.

The peel strength Y is from 0.2 to 10 N/20 mm, preferably from 0.3 to 8 N/20 mm, more preferably from 0.5 to 6 N/20 mm. With the peel strength Y in this range, the close adhesion to a ring frame at the dicing can be enhanced and not only the holding force for the semiconductor wafer can be sufficiently ensured but also the pressure-sensitive adhesive of the second pressure-sensitive adhesive layer can be prevented from transferring (adhesive residue) to the film for semiconductor back surface due to separation between the first pressure-sensitive adhesive layer and the second pressure-sensitive adhesive layer.

The ratio (Y/X) of the peel strength Y to the peel strength X is not particularly limited as long as the effects of the present invention can be obtained, but the ratio is preferably from 3 to 500, more preferably from 4 to 400, still more preferably from 5 to 300. With the ratio in this range, the peel strength Y and the peel strength X can become at the similar degree. Therefore, it is possible to prevent separation not only between the second pressure-sensitive adhesive layer and the film for semiconductor back surface but also between the first pressure-sensitive adhesive layer and the second pressure-sensitive adhesive layer, which would cause adhesive residue or the like from the second pressure-sensitive adhesive layer to the film for semiconductor back surface. In addition, peeling of the film for semiconductor back surface can be prevented from occurring during dicing due to relatively too small peel strength X and incurring contamination of the semiconductor chip.

The relationship of the peel strengths X and Y specified in the present invention can be adjusted by a conventionally known method. Examples thereof include a method of adjusting the curing degree of either one or both of the first and second pressure-sensitive adhesive layers by using a pressure-sensitive adhesive curable with active energy ray such as ultraviolet ray, a method of adjusting the pressure-sensitive adhesive force (modulus) by changing the composition of the pressure-sensitive adhesive used for the pressure-sensitive adhesive layer, a method of applying a surface treatment or layer capable of adjusting the releasability to the surface of the pressure-sensitive adhesive layer, and a combination thereof. Among these methods, considering easy adjustment of the peel strength, a method of adjusting the curing degree by using an active energy ray-curable pressure-sensitive adhesive is preferred.

(Film for Semiconductor Back Surface)

The film for semiconductor back surface 2 has a film shape. The film for semiconductor back surface 2 is usually in an uncured state (including a semi-cured state) in the embodiment of the dicing tape-integrated film for semiconductor back surface as a product and is thermally cured after the dicing tape-integrated film for semiconductor back surface is attached to the semiconductor wafer.

Preferably, the film for semiconductor back surface 2 is formed of at least a thermosetting resin, more preferably formed of at least a thermosetting resin and a thermoplastic resin. When the film for semiconductor back surface 2 is formed of at least a thermosetting resin, the film can effectively exhibit its adhesive function.

Examples of the thermoplastic resin include natural rubber, butyl rubber, isoprene rubber, chloroprene rubber, an ethylene-vinyl acetate copolymer, an ethylene-acrylic acid copolymer, an ethylene-acrylic acid ester copolymer, a polybutadiene resin, a polycarbonate resin, a thermoplastic polyimide resin, a polyamide resin such as 6-nylon and 6,6-nylon, a phenoxy resin, an acrylic resin, a saturated polyester resin such as PET (polyethylene terephthalate) or PBT (polybutylene terephthalate), a polyamideimide resin, or a fluorine resin. The thermoplastic resin may be employed singly or in a combination of two or more kinds. Among these thermoplastic resins, an acrylic resin containing a small amount of ionic impurities, having high heat resistance and capable of securing reliability of a semiconductor element is especially preferable.

The acrylic resins are not particularly restricted, and examples thereof include polymers containing one kind or two or more kinds of esters of acrylic acid or methacrylic acid having a straight chain or branched alkyl group having 30 or less carbon atoms, preferably 4 to 18 carbon atoms, more preferably 6 to 10 carbon atoms, and especially 8 or 9 carbon atoms as component(s). Namely, in the invention, the acrylic resin has a broad meaning also including a methacrylic resin. Examples of the alkyl group include a methyl group, an ethyl group, a propyl group, an isopropyl group, an n-butyl group, a t-butyl group, an isobutyl group, a pentyl group, an isopentyl group, a hexyl group, a heptyl group, a 2-ethylhexyl group, an octyl group, an isooctyl group, a nonyl group, an isononyl group, a decyl group, an isodecyl group, an undecyl group, a dodecyl group (lauryl group), a tridecyl group, a tetradecyl group, a stearyl group, and an octadecyl group.

Moreover, other monomers for forming the acrylic resins (monomers other than the alkyl esters of acrylic acid or methacrylic acid in which the alkyl group is one having 30 or less carbon atoms) are not particularly restricted, and examples thereof include carboxyl group-containing monomers such as acrylic acid, methacrylic acid, carboxylethyl acrylate, carboxylpentyl acrylate, itaconic acid, maleic acid, fumaric acid, and crotonic acid; acid anhydride monomers such as maleic anhydride and itaconic anhydride; hydroxyl group-containing monomers such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl (meth)acrylate, and (4-hydroxymethylcyclohexyl)-methylacrylate; sulfonic acid group-containing monomers such as styrenesulfonic acid, allylsulfonic acid, 2-(meth)acrylamido-2-methylpropanesulfonic acid, (meth)acrylamidopropanesulfonic acid, sulfopropyl(meth)acrylate, and (meth)acryloyloxynaphthalenesulfonic acid; and phosphoric acid group-containing monomers such as 2-hydroxyethylacryloyl phosphate. In this regard, the (meth)acrylic acid means acrylic acid and/or methacrylic acid, (meth)acrylate means acrylate and/or methacrylate, (meth)acryl means acryl and/or methacryl, etc., which shall be applied over the whole specification.

Moreover, examples of the thermosetting resin include, in addition to an epoxy resin and a phenol resin, an amino resin, an unsaturated polyester resin, a polyurethane resin, a silicone resin and a thermosetting polyimide resin. The thermosetting resin may be employed singly or in a combination of two or more kinds. As the thermosetting resin, an epoxy resin containing only a small amount of ionic impurities which corrode a semiconductor element is suitable. Also, the phenol resin is suitably used as a curing agent of the epoxy resins.

The epoxy resin is not particularly restricted and, for example, a difunctional epoxy resin or a polyfunctional epoxy resin such as a bisphenol A type epoxy resin, a bisphenol F type epoxy resin, a bisphenol S type epoxy resin, a brominated bisphenol A type epoxy resin, a hydrogenated bisphenol A type epoxy resin, a bisphenol AF type epoxy resin, a biphenyl type epoxy resin, a naphthalene type epoxy resin, a fluorene type epoxy resin, a phenol novolak type epoxy resin, an o-cresol novolak type epoxy resin, a trishydroxyphenylmethane type epoxy resin and a tetraphenylolethane type epoxy resin, or an epoxy resin such as a hydantoin type epoxy resin, a trisglycidylisocyanurate type epoxy resin or a glycidylamine type epoxy resin may be used.

As the epoxy resin, among those exemplified above, a novolak type epoxy resin, a biphenyl type epoxy resin, a trishydroxyphenylmethane type epoxy resin, and a tetraphenylolethane type epoxy resin are preferable. This is because these epoxy resins have high reactivity with a phenol resin as a curing agent and are superior in heat resistance and the like.

Furthermore, the above-mentioned phenol resin acts as a curing agent of the epoxy resin, and examples thereof include novolak type phenol resins such as phenol novolak resins, phenol aralkyl resins, cresol novolak resins, tert-butylphenol novolak resins, and nonylphenol novolak resins; resol type phenol resins; and polyoxystyrenes such as poly-p-oxystyrene. The phenol resin may be employed singly or in a combination of two or more kinds. Among these phenol resins, phenol novolak resins and phenol aralkyl resins are especially preferable. This is because connection reliability of the semiconductor device can be improved.

The mixing ratio of the epoxy resin to the phenol resin is preferably made, for example, such that the hydroxyl group in the phenol resin becomes 0.5 to 2.0 equivalents per equivalent of the epoxy group in the epoxy resin component. It is more preferably 0.8 to 1.2 equivalents. That is, when the mixing ratio becomes outside the range, a curing reaction does not proceed sufficiently, and the characteristics of the epoxy resin cured product tends to deteriorate.

The content of the thermosetting resin is preferably from 5% by weight to 90% by weight of all the resin components in the film 2 for semiconductor back surface, more preferably from 10% by weight to 85% by weight, even more preferably from 15% by weight to 80% by weight. When the content is 5% by weight or more, then the thermosetting shrinkage may be readily controlled to be 2% by volume or more. In addition, in thermally curing the encapsulating resin, the film 2 for semiconductor back surface may be fully thermo-cured so as to be surely adhered and fixed to the back surface of a semiconductor element to give a flip chip type semiconductor device with no peeling failure. On the other hand, when the content is 90% by weight or less, then the package (PKG, flip chip type semiconductor device) may be prevented from warping.

Not specifically defined, the thermal curing-accelerating catalyst for epoxy resins and phenolic resins may be suitably selected from known thermal curing-accelerating catalysts. One or more thermal curing-accelerating catalysts may be used here either singly or as combined. As the thermal curing-accelerating catalyst, for example, an amine-based curing-accelerating catalyst, a phosphorus-based curing-accelerating catalyst, an imidazole-based curing-accelerating catalyst, a boron-based curing-accelerating catalyst, or a phosphorus-boron-based curing-accelerating catalyst can be used.

The film for semiconductor back surface is particularly suitably formed of a resin composition containing an epoxy resin and a phenolic resin or a resin composition containing an epoxy resin, a phenolic resin, and an acrylic resin. Since these resins contain only a small amount of ionic impurities and have high heat resistance, reliability of semiconductor elements can be secured.

It is important that the film 2 for semiconductor back surface has adhesiveness (close adhesiveness) to the back surface (non-circuit-formed face) of semiconductor wafer. The film 2 for semiconductor back surface can be, for example, formed of a resin composition containing an epoxy resin as a thermosetting resin component. In case where the film 2 for semiconductor back surface is cured beforehand to some degree, at its preparation, it is preferable to add a polyfunctional compound capable of reacting with the functional group or the like at the molecular chain end of the polymer as a crosslinking agent. Thereby, adhesive characteristics under high temperature can be enhanced and improvement of the heat resistance of the film can be achieved.

The adhesive force of the film for semiconductor back surface to semiconductor wafer (23° C., peeling angle of 180 degrees, peeling rate of 300 min/min) is preferably within a range of from 0.5 N/20 mm to 15 N/20 mm, more preferably from 0.7 N/20 mm to 10 N/20 mm. When the adhesive force is at least 0.5 N/20 mm, then the film can be adhered to semiconductor wafer and semiconductor element with excellent adhesiveness and is free from film swelling or the like adhesion failure. In addition, in dicing of semiconductor wafer, the chips can be prevented from flying out. On the other hand, when the adhesive force is at most 15 N/20 mm, then it facilitates peeling from the dicing tape.

The crosslinking agent is not particularly restricted and known crosslinking agents can be used. Specifically, for example, not only isocyanate-based crosslinking agents, epoxy-based crosslinking agents, melamine-based crosslinking agents, and peroxide-based crosslinking agents but also urea-based crosslinking agents, metal alkoxide-based crosslinking agents, metal chelate-based crosslinking agents, metal salt-based crosslinking agents, carbodiimide-based crosslinking agents, oxazoline-based crosslinking agents, aziridine-based crosslinking agents, amine-based crosslinking agents, and the like may be mentioned. As the crosslinking agent, an isocyanate-based crosslinking agent or an epoxy-based crosslinking agent is suitable. The crosslinking agent may be employed singly or in a combination of two or more kinds.

Examples of the isocyanate-based crosslinking agents include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylylene diisocyanate; and aromatic polyisocyanates such as 2,4-tolylene diisocyanate, 2,6-tolylene diisocyanate, 4,4'-diphenylmethane diisocyanate, and xylylene diisocyanate. In addition, a trimethylolpropane/tolylene diisocyanate trimer adduct [a trade name "COLONATE L" manufactured by Nippon Polyurethane Industry Co., Ltd.], a trimethylolpropane/hexamethylene diisocyanate trimer adduct [a trade name "COLONATE HL" manufactured by Nippon Polyurethane Industry Co., Ltd.], and the like are also used. Moreover, examples of the epoxy-based crosslinking agents include N,N,N',N'-tetraglycidyl-m-xylenediamine, diglycidylaniline, 1,3-bis(N,N-glycidylaminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropnane polyglycidyl ether, adipic acid diglycidyl ester, o-phthalic acid diglycidyl ester, triglycidyl-tris(2-hydroxyethyl)isocyanurate, resorcin diglycidyl ether, and bisphenol-S-diglycidyl ether, and also epoxy-based resins having two or more epoxy groups in the molecule.

The amount of the crosslinking agent to be used is not particularly restricted and can be appropriately selected depending on the degree of the crosslinking. Specifically, it is preferable that the amount of the crosslinking agent to be used is usually 7 parts by weight or less (for example, 0.05 to 7 parts by weight) based on 100 parts by weight of the polymer component (particularly, a polymer having a functional group at the molecular chain end). When the amount of the crosslinking agent is larger than 7 parts by weight based on 100 parts by weight of the polymer component, the adhesive force is lowered, so that the case is not preferred. From the viewpoint of improving the cohesive force, the amount of the crosslinking agent is preferably 0.05 parts by weight or more based on 100 parts by weight of the polymer component.

In the invention, instead of the use of the crosslinking agent or together with the use of the crosslinking agent, it is also possible to perform a crosslinking treatment by irradiation with an electron beam, UV light, or the like.

The film for semiconductor back surface is preferably colored. Thereby, an excellent laser marking property and an excellent appearance property can be exhibited, and it becomes possible to make a semiconductor device having a value-added appearance property. As above, since the colored film for semiconductor back surface has an excellent marking property, marking can be performed to impart various kinds of information such as literal information and graphical information to the face on the non-circuit side of the semiconductor element or a semiconductor device using the semiconductor element by utilizing any of various marking methods such as a printing method and a laser marking method through the film of semiconductor back surface. Particularly, by controlling the color of coloring, it becomes possible to observe the information (for example, literal information and graphical information) imparted by marking with excellent visibility. Moreover, when the film for semiconductor back surface is colored, the dicing tape and the film for semiconductor back surface can be easily distinguished from each other, so that workability and the like can be enhanced. Furthermore, for example, as a semiconductor device, it is possible to classify products thereof by using different colors. In the case where the film for semiconductor back surface is colored (the case where the film is neither colorless nor transparent), the color shown by coloring is not particularly limited but, for example, is preferably dark color such as black, blue or red color, and black color is especially suitable.

In the present embodiment, dark color basically means a dark color having L*, defined in L*a*b* color space, of 60 or smaller (0 to 60), preferably 50 or smaller (0 to 50), and more preferably 40 or smaller (0 to 40).

Moreover, black color basically means a black-based color having L*, defined in L*a*b* color space, of 35 or smaller (0 to 35), preferably 30 or smaller (0 to 30), and more preferably 25 or smaller (0 to 25). In this regard, in the black color, each of a* and b*, defined in the L*a*b* color space, can be suitably selected according to the value of L*. For example, both of a* and b* are within the range of preferably −10 to 10, more preferably −5 to 5, and further preferably −3 to 3 (particularly 0 or about 0).

In the present embodiment, L*, a*, and b* defined in the L*a*b* color space can be determined by a measurement with a color difference meter (a trade name "CR-200" manufactured by Minolta Ltd; color difference meter). The L*a*b* color space is a color space recommended by the Commission Internationale de l'Eclairage (CIE) in 1976, and means a color space called CIE1976(L*a*b*) color space. Also, the L*a*b* color space is defined in Japanese Industrial Standards in JIS Z8729.

At coloring of the film for semiconductor back surface, according to an objective color, a colorant (coloring agent) can be used. As such a colorant, various dark-colored colorants such as black-colored colorants, blue-colored colorants, and red-colored colorants can be suitably used and black-colored colorants are more suitable. The colorant may be any of pigments and dyes. The colorant may be employed singly or in combination of two or more kinds. In this regard, as the dyes, it is possible to use any forms of dyes such as acid dyes, reactive dyes, direct dyes, disperse dyes, and cationic dyes. Moreover, also with regard to the pigments, the form thereof is not particularly restricted and can be suitably selected and used among known pigments.

In particular, when a dye is used as a colorant, the dye becomes in a state that it is homogeneously or almost homogeneously dispersed by dissolution in the film for semiconductor back surface, so that the film for semiconductor back surface (as a result, the dicing tape-integrated film for semiconductor back surface) having a homogeneous or almost homogeneous color density can be easily produced. Accordingly, when a dye is used as a colorant, the film for semiconductor back surface in the dicing tape-integrated film for semiconductor back surface can have a homogeneous or almost homogeneous color density and can enhance a marking property and an appearance property.

The black-colored colorant is not particularly restricted and can be, for example, suitably selected from inorganic black-colored pigments and black-colored dyes. Moreover, the black-colored colorant may be a colorant mixture in which a cyan-colored colorant (blue-green colorant), a magenta-colored colorant (red-purple colorant), and a yellow-colored colorant (yellow colorant) are mixed. The black-colored colorant may be employed singly or in a combination of two or more kinds. Of course, the black-colored colorant may be used in combination with a colorant of a color other than black.

Specific examples of the black-colored colorant include carbon black (such as furnace black, channel black, acetylene black, thermal black, or lamp black), graphite, copper oxide, manganese dioxide, azo-type pigments (such as azomethine azo black), aniline black, perylene black, titanium black, cyanine black, active charcoal, ferrite (such as non-magnetic ferrite or magnetic ferrite), magnetite, chromium oxide, iron oxide, molybdenum disulfide, a chromium complex, a composite oxide type black pigment, and an anthraquinone type organic black pigment.

In the invention, as the black-colored colorant, black-colored dyes such as C.I. Solvent Black 3, 7, 22, 27, 29, 34, 43, 70, C.I. Direct Black 17, 19, 22, 32, 38, 51, 71, C.I. Acid Black 1, 2, 24, 26, 31, 48, 52, 107, 109, 110, 119, 154, and C.I. Disperse Black 1, 3, 10, 24; black-colored pigments such as C.I. Pigment Black 1, 7; and the like can also be utilized.

As such black-colored colorants, for example, a trade name "Oil Black BY", a trade name "Oil Black BS", a trade name "Oil Black HBB", a trade name "Oil Black 803", a trade name "Oil Black 860", a trade name "Oil Black 5970", a trade name "Oil Black 5906", a trade name "Oil Black 5905" (manufactured by Orient Chemical Industries Co., Ltd.), and the like are commercially available.

Examples of colorants other than the black-colored colorant include cyan-colored colorants, magenta-colored colorants, and yellow-colored colorants. Examples of the cyan-colored colorants include cyan-colored dyes such as C.I. Solvent Blue 25, 36, 60, 70, 93, 95; C.I. Acid Blue 6 and 45; cyan-colored pigments such as C.I. Pigment Blue 1, 2, 3, 15, 15:1, 15:2, 15:3, 15:4, 15:5, 15:6, 16, 17, 17:1, 18, 22, 25, 56, 60, 63, 65, 66; C.I. Vat Blue 4, 60; and C.I. Pigment Green 7.

Moreover, among the magenta colorants, examples of magenta-colored dye include C.I. Solvent Red 1, 3, 8, 23, 24, 25, 27, 30, 49, 52, 58, 63, 81, 82, 83, 84, 100, 109, 111, 121, 122; C.I. Disperse Red 9; C.I. Solvent Violet 8, 13, 14, 21, 27; C.I. Disperse Violet 1; C.I. Basic Red 1, 2, 9, 12, 13, 14, 15, 17, 18, 22, 23, 24, 27, 29, 32, 34, 35, 36, 37, 38, 39, 40; C.I. Basic Violet 1, 3, 7, 10, 14, 15, 21, 25, 26, 27 and 28.

Among the magenta-colored colorants, examples of magenta-colored pigment include C.I. Pigment Red 1, 2, 3, 4, 5, 6, 7, 8, 9, 10, 11, 12, 13, 14, 15, 16, 17, 18, 19, 21, 22, 23, 30, 31, 32, 37, 38, 39, 40, 41, 42, 48:1, 48:2, 48:3, 48:4, 49, 49:1, 50, 51, 52, 52:2, 53:1, 54, 55, 56, 57:1, 58, 60, 60:1, 63, 63:1, 63:2, 64, 64:1, 67, 68, 81, 83, 87, 88, 89, 90, 92, 101, 104, 105, 106, 108, 112, 114, 122, 123, 139, 144, 146, 147, 149, 150, 151, 163, 166, 168, 170, 171, 172, 175, 176, 177, 178, 179, 184, 185, 187, 190, 193, 202, 206, 207, 209, 219, 222, 224, 238, 245; C.I. Pigment Violet 3, 9, 19, 23, 31, 32, 33, 36, 38, 43, 50; C.I. Vat Red 1, 2, 10, 13, 15, 23, 29 and 35.

Moreover, examples of the yellow-colored colorants include yellow-colored dyes such as C.I. Solvent Yellow 19, 44, 77, 79, 81, 82, 93, 98, 103, 104, 112, and 162; yellow-colored pigments such as C.I. Pigment Orange 31, 43; C.I. Pigment Yellow 1, 2, 3, 4, 5, 6, 7, 10, 11, 12, 13, 14, 15, 16, 17, 23, 24, 34, 35, 37, 42, 53, 55, 65, 73, 74, 75, 81, 83, 93, 94, 95, 97, 98, 100, 101, 104, 108, 109, 110, 113, 114, 116, 117, 120, 128, 129, 133, 138, 139, 147, 150, 151, 153, 154, 155, 156, 167, 172, 173, 180, 185, 195; C.I. Vat Yellow 1, 3, and 20.

Various colorants such as cyan-colored colorants, magenta-colored colorants, and yellow-colorant colorants may be employed singly or in a combination of two or more kinds, respectively. In this regard, in the case where two or more kinds of various colorants such as cyan-colored colorants, magenta-colored colorants, and yellow-colorant colorants are used, the mixing ratio (or blending ratio) of these colorants is not particularly restricted and can be suitably selected according to the kind of each colorant, an objective color, and the like.

In the case where the film 2 for semiconductor back surface is colored, the colored form is not particularly restricted. The film for semiconductor back surface may be, for example, a single-layer film-shaped article added with a coloring agent. Moreover, the film may be a laminated film where a resin layer formed of at least a thermosetting resin and a coloring agent layer are at least laminated. In this regard, in the case where the film 2 for semiconductor back surface is a laminated film of the resin layer and the coloring agent layer, the film 2 for semiconductor back surface in the laminated form preferably has a laminated form of a resin layer/a coloring agent layer/a resin layer. In this case, two resin layers at both sides of the coloring agent layer may be resin layers having the same composition or may be resin layers having different composition.

Into the film 2 for semiconductor back surface, other additives can be suitably blended according to the necessity. Examples of the other additives include an extender, an anti-aging agent, an antioxidant, and a surfactant, in addition to a filler, a flame retardant, a silane-coupling agent, and an ion-trapping agent.

The filler may be any of an inorganic filler and an organic filler but an inorganic filler is suitable. By blending a filler such as an inorganic filler, imparting of electric conductivity to the film for semiconductor back surface, improvement of the thermal conductivity, control of elastic modulus, and the like can be achieved. In this regard, the film 2 for semiconductor back surface may be electrically conductive or non-conductive. Examples of the inorganic filler include various inorganic powders composed of silica, clay, gypsum, calcium carbonate, barium sulfate, alumina oxide, beryllium oxide, ceramics such as silicone carbide and silicone nitride, metals or alloys such as aluminum, copper, silver, gold, nickel, chromium, lead, tin, zinc, palladium, and solder, carbon, and the like. The filler may be employed singly or in a combination of two or more kinds. Particularly, the filler is suitably silica and more suitably fused silica. The average particle diameter of the inorganic filler is preferably within the range of 0.1 μm to 80 μm. The average particle diameter of the inorganic filler can be measured by a laser diffraction-type particle size distribution measurement apparatus.

The blending amount of the filler (in particular, inorganic filler) is preferably 80 parts by weight or less (0 part by weight to 80 parts by weight) and more preferably 0 part by weight to 70 parts by weight based on 100 parts by weight of the organic resin components.

Examples of the flame retardant include antimony trioxide, antimony pentoxide, and brominated epoxy resins. The flame retardant may be employed singly or in a combination of two or more kinds. Examples of the silane coupling agent include β-(3,4-epoxycyclohexyl)ethyltrimethoxysilane, γ-glycidoxypropyltrimethoxysilane, and γ-glycidoxypropylmethyldiethoxysilane. The silane coupling agent may be employed singly or in a combination of two or more kinds. Examples of the ion-trapping agent include hydrotalcites and bismuth hydroxide. The ion-trapping agent may be employed singly or in a combination of two or more kinds.

The film 2 for semiconductor back surface can be, for example, formed by utilizing a commonly used method including mixing a thermosetting resin such as an epoxy resin and, if necessary, a thermoplastic resin such as an acrylic resin and optional solvent and other additives to prepare a resin composition, followed by forming it to a film-shaped layer. Specifically, a film-shaped layer (adhesive layer) as the film for semiconductor back surface can be formed, for example, by a method including applying the resin composition on the pressure-sensitive adhesive layer 32 of the dicing tape; a method including applying the resin composition on an appropriate separator (such as release paper) to form a resin layer (or an adhesive layer) and then transferring (transcribing) it on the pressure-sensitive adhesive layer 32; or the like. In this regard, the resin composition may be a solution or a dispersion.

Incidentally, in the case where the film 2 for semiconductor back surface is formed of a resin composition containing a thermosetting resin such as an epoxy resin, the film for semiconductor back surface is in a state that the thermosetting resin is uncured or partially cured at a stage before the film is applied to a semiconductor wafer. In this case, after it is applied to the semiconductor wafer (specifically, usually, at the time when the encapsulating material is cured in the flip chip bonding step), the thermosetting resin in the film for semiconductor back surface is completely or almost completely cured.

As above, since the film for semiconductor back surface is in a state that the thermosetting resin is uncured or partially cured even when the film contains the thermosetting resin, the gel fraction of the film for semiconductor back surface is not particularly restricted but is, for example, suitably selected from the range of 50% by weight or less (0 to 50% by weight) and is preferably 30% by weight or less (0 to 30% by weight) and particularly preferably 10% by weight or less (0 to 10% by weight). The gel fraction of the film for semiconductor back surface can be measured by the following measuring method.

<Gel Fraction Measuring Method>

About 0.1 g of a sample is sampled from the film 2 for semiconductor back surface and precisely weighed (weight of sample) and, after the sample is wrapped in a mesh-type sheet, it is immersed in about 50 mL of toluene at room temperature for 1 week. Thereafter, a solvent-insoluble matter (content in the mesh-type sheet) is taken out of the toluene and dried at 130° C. for about 2 hours, the solvent-insoluble matter after drying is weighed (weight after immersion and drying), and a gel fraction (% by weight) is then calculated according to the following expression (a).

$$\text{Gel fraction (\% by weight)} = [(\text{Weight after immersion and Drying})/(\text{Weight of sample})] \times 100 \quad (a)$$

The gel fraction of the film for semiconductor back surface can be controlled by the kind and content of the resin components and the kind and content of the crosslinking agent and besides, heating temperature, heating time and the like.

In the invention, in the case where the film for semiconductor back surface is a film-shaped article formed of a resin composition containing a thermosetting resin such as an epoxy resin, close adhesiveness to a semiconductor wafer can be effectively exhibited.

Incidentally, since cutting water is used in the dicing step of the semiconductor wafer, the film for semiconductor back surface absorbs moisture to have a moisture content of a normal state or more in some cases. When flip chip bonding is performed with still maintaining such a high moisture content, water vapor remains at the adhesion interface between the film for semiconductor back surface and the semiconductor wafer or its processed body (semiconductor) and lifting is generated in some cases. Therefore, by constituting the film for semiconductor back surface as a configuration in which a core material having a high moisture permeability is provided on each surface thereof, water vapor diffuses and thus it becomes possible to avoid such a problem. From such a viewpoint, a multilayered structure in which the film for semiconductor back surface is formed at one surface or both surfaces of the core material may be used as the film for semiconductor back surface. Examples of the core material include films (e.g., polyimide films, polyester films, polyethylene terephthalate films, polyethylene naphthalate films, polycarbonate films, etc.), resin substrates reinforced with a glass fiber or a plastic nonwoven fiber, silicon substrates, and glass substrates.

The thickness (total thickness in the case of the laminated film) of the film 2 for semiconductor back surface is not particularly restricted but can be, for example, suitably selected from the range of about 2 μm to 200 μm. Furthermore, the thickness is preferably about 4 μm to 160 μM, more preferably about 6 μm to 100 μm, and particularly about 10 μm to 80 μm.

The tensile storage elastic modulus of the film 2 for semiconductor back surface in an uncured state at 23° C. is preferably 1 GPa or more (e.g., 1 GPa to 50 GPa), more preferably 2 GPa or more, and particularly, 3 GPa or more is suitable. When the tensile storage elastic modulus is 1 GPa or more, the attachment of the film for semiconductor back surface to a support can be effectively suppressed or prevented at the time when the film 2 for semiconductor back surface is placed on the support and transportation and the like are performed after the semiconductor chip is peeled from the pressure-sensitive adhesive layer 32 of the dicing tape together with the film 2 for semiconductor back surface. In this regard, the support is, for example, a top tape, a bottom tape, and the like in a carrier tape. In the case where the film 2 for semiconductor back surface is formed of a resin composition containing a thermosetting resin, as mentioned above, the thermosetting resin is usually in a uncured or partially cured state, so that the tensile storage elastic modulus of the film for semiconductor back surface at 23° C. is a tensile storage elastic modulus at 23° C. in a state that the thermosetting resin is uncured or partially cured.

Here, the film 2 for semiconductor back surface may be either a single layer or a laminated film where a plurality of layers are laminated. In the case of the laminated film, the tensile storage elastic modulus is sufficiently 1 GPa or more (e.g., 1 GPa to 50 GPa) as the whole laminated film in an uncured state. Also the tensile storage elastic modulus (23° C.) of the film for semiconductor back surface in an uncured state can be controlled by suitably setting up the kind and content of the resin components (thermoplastic resin and/or thermosetting resin) or the kind and content of a filler such as a silica filler. In the case where the film 2 for semiconductor back surface is a laminated film where a plurality of layers are laminated (in the case where the film for semiconductor back surface has a form of the laminated layer), as the laminated layer form, for example, a laminated form composed of a wafer adhesive layer and a laser marking layer can be exemplified. Moreover, between the wafer adhesive layer and the laser marking layer, other layers (an intermediate layer, a light-shielding layer, a reinforcing layer, a colored layer, a base material layer, an electromagnetic wave-shielding layer, a heat conductive layer, a pressure-sensitive adhesive layer, etc.) may be provided. In this regard, the wafer adhesive layer is a layer which exhibits an excellent close adhesiveness (adhesive property) to a wafer and a layer which comes into contact with the back surface of a wafer. On the other hand, the laser marking layer is a layer which exhibits an excellent laser marking property and a layer which is utilized at the laser marking on the back surface of a semiconductor chip.

The tensile storage elastic modulus is determined by preparing the film 2 for semiconductor back surface in an uncured state without lamination onto the dicing tape 3 and measuring elastic modulus in a tensile mode under conditions of a sample width of 10 mm, a sample length of 22.5 mm, a sample thickness of 0.2 mm, a frequency of 1 Hz, and a temperature elevating rate of 10° C./minute under a nitrogen atmosphere at a prescribed temperature (23° C.) using a dynamic viscoelasticity measuring apparatus "Solid Analyzer RS A2" manufactured by Rheometrics Co. Ltd. and the measured elastic modulus is regarded as a value of tensile storage elastic modulus obtained.

Preferably, the film 2 for semiconductor back surface is protected with a separator (release liner) on at least one surface thereof (not shown in figures). For example, in the dicing tape-integrated film 1 for semiconductor back surface, a separator may be provided on at least one surface of the film for semiconductor back surface. On the other hand, in the film for semiconductor back surface not integrated with a dicing tape, a separator may be provided on one surface or both surfaces of the film for semiconductor back surface. The separator has a function as a protective material for protecting the film for semiconductor back surface until it is practically used. Further, in the dicing tape-integrated film 1 for semiconductor back surface, the separator may further serve as the supporting base material in transferring the film 2 for semiconductor back surface onto the pressure-sensitive adhesive layer 32 of the base material of the dicing tape. The separator is peeled off when a semiconductor wafer is attached onto the film for semiconductor back surface. As the separator, a film of polyethylene or polypropylene, as well as a plastic film (such as polyethylene terephthalate), a paper or the like whose surface is coated with a releasing agent such as a fluorine-based releasing agent or a long-chain alkyl acrylate-based releasing agent can also be used. The separator can be formed by a conventionally known method. Moreover, the thickness or the like of the separator is not particularly restricted.

In case where the film 2 for semiconductor back surface is not laminated with the dicing tape 3, the film 2 for semiconductor back surface may be wound up along with one separator having a release layer on both sides thereof, into a roll in which the film 2 is protected with the separator having a release layer on both surfaces thereof; or the film 2 may be protected with a separator having a release layer on at least one surface thereof.

Moreover, the light transmittance with a visible light (visible light transmittance, wavelength: 400 to 800 nm) in the film 2 for semiconductor back surface is not particularly restricted but is, for example, preferably in the range of 20% or less (0 to 20%), more preferably 10% or less (0 to 10%), and particularly preferably 5% or less (0 to 5%). When the film 2 for semiconductor back surface has a visible light transmittance of more than 20%, there is a concern that the transmission of the light may adversely influence the semiconductor element. The visible light transmittance (%) can be controlled by the kind and content of the resin components of the film 2 for semiconductor back surface, the kind and content of the coloring agent (such as pigment or dye), the content of the inorganic filer, and the like.

The visible light transmittance (%) of the film 2 for semiconductor back surface can be determined as follows. Namely, a film 2 for semiconductor back surface having a thickness (average thickness) of 20 μm itself is prepared. Then, the film 2 for semiconductor back surface is irradiated with a visible light having a wavelength of 400 to 800 nm in a prescribed intensity [apparatus: a visible light generating apparatus manufactured by Shimadzu Corporation [trade name "ABSORPTION SPECTRO PHOTOMETER"], and the intensity of transmitted visible light is measured. Further, the visible light transmittance (%) can be determined based on intensity change before and after the transmittance of the visible light through the film 2 for semiconductor back surface. In this regard, it is also possible to derive visible light transmittance (%; wavelength: 400 to 800 nm) of the film 2 for semiconductor back surface having a thickness of 20 μm from the value of the visible light transmittance (%; wavelength: 400 to 800 nm) of the film 2 for semiconductor back surface whose thickness is not 20 μm. In the invention, the visible light transmittance (%) is determined in the case of the film 2 for semiconductor back surface having a thickness of 20 μm, but the film for semiconductor back surface according to the invention is not limited to one having a thickness of 20 μm.

Moreover, as the film 2 for semiconductor back surface, one having lower moisture absorbance is more preferred. Specifically, the moisture absorbance is preferably 1% by weight or less and more preferably 0.8% by weight or less. By regulating the moisture absorbance to 1% by weight or less, the laser marking property can be enhanced. Moreover, for example, the generation of voids between the film 2 for semiconductor back surface and the semiconductor element can be suppressed or prevented in the reflow step. The moisture absorbance is a value calculated from a weight change before and after the film 2 for semiconductor back surface is allowed to stand under an atmosphere of a temperature of 85° C. and a humidity of 85% RH for 168 hours. In the case where the film 2 for semiconductor back surface is formed of a resin composition containing a thermosetting resin, the moisture absorbance means a value obtained when the film after thermal curing is allowed to stand under an atmosphere of a temperature of 85° C. and a humidity of 85% RH for 168 hours. Moreover, the moisture absorbance can be regulated, for example, by changing the amount of the inorganic filler to be added.

Moreover, as the film 2 for semiconductor back surface, one having a smaller ratio of volatile matter is more preferred. Specifically, the ratio of weight decrease (weight decrease ratio) of the film 2 for semiconductor back surface after heating treatment is preferably 1% by weight or less and more preferably 0.8% by weight or less. The conditions for the heating treatment are a heating temperature of 250° C. and a heating time of 1 hour. By regulating the weight decrease ratio to 1% by weight or less, the laser marking property can be enhanced. Moreover, for example, the generation of cracks in a flip chip type semiconductor device can be suppressed or prevented in the reflow step. The weight decrease ratio can be regulated, for example, by adding an inorganic substance capable of reducing the crack generation at lead-free solder reflow. In the case where the film 2 for semiconductor back surface is formed of a resin composition containing a thermosetting resin component, the weight decrease ratio is a value obtained when the film for semiconductor back surface after thermal curing is heated under conditions of a temperature of 250° C. and a heating time of 1 hour.

(Dicing Tape)

The dicing tape 3 is fabricated by forming a pressure-sensitive adhesive layer 32 on a base material 31. The pressure-sensitive adhesive layer 32 includes a first pressure-sensitive adhesive layer 32*a* formed on the base material 31 and a second pressure-sensitive adhesive layer 32*b* formed on the first pressure-sensitive adhesive layer 32*a*. In this way, the dicing tape 3 may be sufficient if it has a configuration where a base material 31 and a pressure-sensitive adhesive layer 32 are stacked.

(Base Material)

The base material (supporting base material) can be used as a supporting material for the pressure-sensitive adhesive layer and the like. The base material 31 preferably has a radiation ray-transmitting property. As the base material 31, for example, suitable thin materials, e.g., paper-based base materials such as paper; fiber-based base materials such as fabrics, non-woven fabrics, felts, and nets; metal-based base materials such as metal foils and metal plates; plastic base materials such as plastic films and sheets; rubber-based base materials such as rubber sheets; foamed bodies such as foamed sheets; and laminates thereof [particularly, laminates of plastic based materials with other base materials, laminates of plastic films (or sheets) each other, etc.] can be used. In the invention, as the base material, plastic base materials such as plastic films and sheets can be suitably employed. Examples of raw materials for such plastic materials include olefinic resins such as polyethylene (PE), polypropylene (PP), and ethylene-propylene copolymers; copolymers using ethylene as a monomer component, such as ethylene-vinyl acetate copolymers (EVA), ionomer resins, ethylene-(meth)acrylic acid copolymers, and ethylene-(meth)acrylic acid ester (random, alternating) copolymers; polyesters such as polyethylene terephthalate (PET), polyethylene naphthalate (PEN), and polybutylene terephthalate (PBT); acrylic resins; polyvinyl chloride (PVC); polyurethanes; polycarbonates; polyphenylene sulfide (PPS); amide-based resins such as polyamides (Nylon) and whole aromatic polyamides (aramide); polyether ether ketones (PEEK); polyimides; polyetherimides; polyvinylidene chloride; ABS (acrylonitrile-butadiene-styrene copolymers); cellulose-based resins; silicone resins; and fluorinated resins.

In addition, the materials for the base material 31 include polymers such as crosslinked materials of the foregoing resins. The plastic films may be used without stretching or may be used after subjected to a uniaxial or biaxial stretching treatment, if necessary. According to the resin sheet to which thermal contraction property is imparted by a stretching treatment or the like, the adhered area between the pressure-sensitive adhesive layer 32 and the film 2 for semiconductor back surface is reduced by thermal contraction of the base material 31 after dicing and thus the recovery of the semiconductor chip can be facilitated.

A commonly used surface treatment, e.g., a chemical or physical treatment such as a chromate treatment, ozone exposure, flame exposure, exposure to high-voltage electric shock, or an ionized radiation treatment, or a coating treatment with an undercoating agent e.g., a pressure-sensitive adhesive substance to be mentioned later) may be applied onto the surface of the base material 31 in order to enhance close adhesiveness with the adjacent layer, holding properties, and the like.

As the base material 31, the same kind or different kinds of materials can be suitably selected and used and, if necessary, several kinds of materials can be blended and used. Moreover, to the base material 31, for imparting antistatic ability, a vapor deposition layer of a conductive substance having a thickness of about 30 to 500 angstrom, which is composed of a metal, alloy or an oxide thereof, can be formed on the base material 31. The base material 31 may be a single layer or a multilayer of two or more thereof.

The thickness (total thickness in the case of the laminated layer) of the base material 31 is not particularly restricted and can be appropriately selected depending on strength, flexibility, intended purpose of use, and the like. For example, the thickness is generally 1,000 μm or less (e.g., 1 μm to 1,000 μm), preferably 10 μm to 500 μm, further preferably 20 μm to 300 μm, and particularly preferably about 30 μm to 200 μm but is not limited thereto.

Incidentally, the base material 31 may contain various additives (a coloring agent, a filler, a plasticizer, an antiaging agent, an antioxidant, a surfactant, a flame retardant, etc.) within the range where the advantages and the like of the invention are not impaired.

(Pressure-Sensitive Adhesive Layer)

The first pressure-sensitive adhesive layer 32a and the second pressure-sensitive adhesive layer 32b which constitute the pressure-sensitive adhesive layer 32 each are formed of a pressure-sensitive adhesive and have a pressure-sensitive adhesiveness. The pressure-sensitive adhesive may be suitably selected from known pressure-sensitive adhesives without particular limitation, so long as satisfying the relationship between the peel strengths X and Y. Concretely, as the pressure-sensitive adhesive, for example, those having the above-mentioned characteristics are suitably selected from known pressure-sensitive adhesives such as acrylic pressure-sensitive adhesives, rubber-based pressure-sensitive adhesives, vinyl alkyl ether-based pressure-sensitive adhesives, silicone-based pressure-sensitive adhesives, polyester-based pressure-sensitive adhesives, polyamide-based pressure-sensitive adhesives, urethane-based pressure-sensitive adhesives, fluorine-based pressure-sensitive adhesives, styrene-diene block copolymer-based pressure-sensitive adhesives, and creep characteristics-improved pressure-sensitive adhesives prepared by incorporating a thermofusible resin having a melting point of not higher than 200° C. to the above-mentioned pressure-sensitive adhesive (for example, see JP-A 56-61468, JP-A-61-174857, JP-A-63-17981, JP-A-56-13040, herein incorporated by reference), and are used herein. As the pressure-sensitive adhesive, also usable here are radiation-curable pressure-sensitive adhesives (or energy ray-curable pressure-sensitive adhesives) and thermally expandable pressure-sensitive adhesives. One or more such pressure-sensitive adhesives may be used here either singly or as combined.

(First Pressure-Sensitive Adhesive Layer)

As the pressure-sensitive adhesive for the first pressure-sensitive adhesive layer, preferred for use herein are acrylic pressure-sensitive adhesives and rubber-based pressure-sensitive adhesives, and more preferred are acrylic pressure-sensitive adhesives. The acrylic pressure-sensitive adhesives include those comprising, as the base polymer, an acrylic polymer (homopolymer or copolymer) of one or more alkyl (meth)acrylates as monomer component(s).

The alkyl(meth)acrylate for the acrylic pressure-sensitive adhesive includes, for example, methyl(meth)acrylate, ethyl (meth)acrylate, propyl(meth)acrylate, isopropyl(meth)acrylate, butyl(meth)acrylate, isobutyl(meth)acrylate, s-butyl (meth)acrylate, t-butyl(meth)acrylate, pentyl(meth)acrylate, hexyl(meth)acrylate, heptyl(meth)acrylate, octyl(meth)acrylate, 2-ethylhexyl(meth)acrylate, isooctyl(meth)acrylate, nonyl(meth)acrylate, isononyl(meth)acrylate, decyl(meth) acrylate, isodecyl(meth)acrylate, undecyl(meth)acrylate, dodecyl(meth)acrylate, tridecyl(meth)acrylate, tetradecyl (meth)acrylate, pentadecyl(meth)acrylate, hexadecyl(meth) acrylate, heptadecyl(meth)acrylate, octadecyl(meth)acrylate, nonadecyl(meth)acrylate, eicosyl(meth)acrylate, etc. As the alkyl(meth)acrylate, preferred are those in which the alkyl group has from 4 to 18 carbon atoms. In the alkyl(meth) acrylate, the alkyl group may be linear or branched.

The acrylic polymer may contain, if desired, a unit corresponding to any other monomer component copolymerizable with the above-mentioned alkyl(meth)acrylate (copolymerizable monomer component), for the purpose of improving the cohesive force, the heat resistance and the crosslinkability thereof. The copolymerizable monomer component includes, for example, carboxyl group-containing monomers such as (meth)acrylic acid (acrylic acid, methacrylic acid), carboxyethyl acrylate, carboxypentyl acrylate, itaconic acid, maleic acid, fumaric acid, crotonic acid; acid anhydride group-containing monomers such as maleic anhydride, itaconic anhydride; hydroxyl group-containing monomers such as hydroxyethyl(meth)acrylate, hydroxypropyl(meth)acrylate, hydroxybutyl(meth)acrylate, hydroxyhexyl(meth)acrylate, hydroxyoctyl(meth)acrylate, hydroxydecyl(meth)acrylate, hydroxylauryl(meth)acrylate, (4-hydroxymethylcyclohexyl) methyl methacrylate; sulfonic acid group-containing monomers such as styrenesulfonic acid, allylsulfonic acid, 2-(meth)acrylamide-2-methylpropanesulfonic acid, (meth) acrylamide-propanesulfonic acid, sulfopropyl(meth)acrylate, (meth)acryloyloxynaphthalenesulfonic acid; phosphoric acid group-containing monomers such as 2-hydroxyethyl acryloylphosphate; (N-substituted) amide monomers such as (meth)acrylamide, N,N-dimethyl(meth)acrylamide, N-butyl (meth)acrylamide, N-methylol(meth)acrylamide, N-methylolpropane(meth)acrylamide; aminoalkyl(meth)acrylate monomers such as aminoethyl(meth)acrylate, N,N-dimethylaminoethyl(meth)acrylate, t-butylaminoethyl(meth)acrylate; alkoxyalkyl(meth)acrylate monomers such as methoxyethyl(meth)acrylate, ethoxyethyl(meth)acrylate; cyanoacrylate monomers such as acrylonitrile, methacrylonitrile; epoxy group-containing acrylic monomers such as glycidyl(meth)acrylate; styrene monomers such as styrene, α-methylstyrene; vinyl ester monomers such as vinyl acetate, vinyl propionate; olefin monomers such as isoprene, butadiene, isobutylene; vinyl ether monomers such as vinyl ether; nitrogen-containing monomers such as N-vinylpyrrolidone, methylvinylpyrrolidone, vinylpyridine, vinylpiperidone, vinylpyrimidine, vinylpiperazine, vinylpyrazine, vinylpyrrole, vinylimidazole, vinyloxazole, vinylmorpholine, N-vinylcarbonamides, N-vinylcaprolactam; maleimide monomers such as N-cyclohexylmaleimide, N-isopropylmaleimide, N-laurylmaleimide, N-phenylmaleimide; itaconimide monomers such as N-methylitaconimide, N-ethylitaconimide, N-butylitaconimide, N-octylitaconimide, N-2-ethylhexylitaconimide, N-cyclohexylitaconimide, N-laurylitaconimide; succinimide monomers such as N-(meth)acryloyloxymethylenesuccinimide, N-(meth)acryloyl-6-oxyhexamethylenesuccinimide, N-(meth)acryloyl-8-oxyoctamethylenesuccinimide; acryl glycolate monomers such as polyethylene glycol (meth)acrylate, polypropylene glycol (meth)acrylate, methoxyethylene glycol (meth)acrylate, methoxypolypropylene glycol (meth)acrylate; acrylate monomers having a hetero ring, a halogen atom, a silicone atom or the like such as tetrahydrofurfuryl(meth)acrylate, fluoro(meth)acrylate, silicone (meth)acrylate; polyfunctional monomers such as hexanediol di(meth)acrylate, (poly)ethylene glycol di(meth)acrylate, (poly)propylene glycol di(meth)

acrylate, neopentylglycol di(meth)acrylate, pentaerythritol di(meth)acrylate, trimethylolpropane tri(meth)acrylate, pentaerythritol tri(meth)acrylate, dipentaerythritol hexa(meth)acrylate, epoxyacrylate, polyester acrylate, urethane acrylate, divinylbenzene, butyl di(meth)acrylate, hexyl di(meth)acrylate, etc. One or more these copolymerizable monomer components may be used here either singly or as combined.

The radiation-curable pressure-sensitive adhesive (or energy ray-curable pressure-sensitive adhesive) (composition) usable in the invention includes, for example, an internal-type radiation-curable pressure-sensitive adhesive comprising, as the base polymer, a polymer having a radical-reactive carbon-carbon double bond in the polymer side chain, main chain or main chain terminal, and a radiation-curable pressure-sensitive adhesive prepared by incorporating a UV-curable monomer component or oligomer component in a pressure-sensitive adhesive. The thermally expandable pressure-sensitive adhesive also usable here includes, for example, those comprising a pressure-sensitive adhesive and a foaming agent (especially thermally expandable microspheres).

In the invention, the first pressure-sensitive adhesive layer 32a may contain various additives (e.g., a tackifying resin, a coloring agent, a thickener, an extender, a filler, a plasticizer, an antiaging agent, an antioxidant, a surfactant, a crosslinking agent, etc.) within the range where the advantages of the invention are not impaired.

The crosslinking agent is not particularly restricted and known crosslinking agents can be used. Specifically, as the crosslinking agent, not only isocyanate-based crosslinking agents, epoxy-based crosslinking agents, melamine-based crosslinking agents, and peroxide-based crosslinking agents but also urea-based crosslinking agents, metal alkoxide-based crosslinking agents, metal chelate-based crosslinking agents, metal salt-based crosslinking agents, carbodiimide-based crosslinking agents, oxazoline-based crosslinking agents, aziridine-based crosslinking agents, amine-based crosslinking agents, and the like may be mentioned, and isocyanate-based crosslinking agents and epoxy-based crosslinking agents are suitable. The crosslinking agent may be employed singly or in a combination of two or more kinds. Incidentally, the amount of the crosslinking agent to be used is not particularly restricted.

Examples of the isocyanate-based crosslinking agents include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylylene diisocyanate; and aromatic polyisocyanates such as 2,4-tolylene diisocyanate, 2,6-tolylene diisocyanate, 4,4'-diphenylmethane diisocyanate, and xylylene diisocyanate. In addition, a trimethylolpropane/tolylene diisocyanate trimer adduct [a trade name "COLONATE L" manufactured by Nippon Polyurethane Industry Co., Ltd.], a trimethylolpropane/hexamethylene diisocyanate trimer adduct [a trade name "COLONATE HL" manufactured by Nippon Polyurethane Industry Co., Ltd.], and the like are also used. Moreover, examples of the epoxy-based crosslinking agents include N,N,N',N'-tetraglycidyl-m-xylenediamine, diglycidylaniline, 1,3-bis(N,N-glycidylaminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropnane polyglycidyl ether, adipic acid diglycidyl ester, o-phthalic acid diglycidyl ester, triglycidyl-tris(2-hydroxyethyl)isocyanurate, resorcin diglycidyl ether, and bisphenol-S-diglycidyl ether, and also epoxy-based resins having two or more epoxy groups in the molecule.

In place of using the crosslinking agent or along with the crosslinking agent, the first pressure-sensitive adhesive layer 32a may be crosslinked through irradiation with electron rays or UV rays.

The thickness of the first pressure-sensitive adhesive layer 32a is not particularly limited and is, for example, approximately from 5 to 300 μm (preferably from 5 to 200 more preferably from 5 to 100 μm, still more preferably from 7 to 50 μm). When the thickness of the first pressure-sensitive adhesive layer 32a is in the range above, an appropriate pressure-sensitive adhesive force can be exerted. The first pressure-sensitive adhesive layer 32a may be formed as either a single layer or a multilayer.

(Second Pressure-Sensitive Adhesive Layer)

The second pressure-sensitive adhesive layer 32b is preferably composed of an ultraviolet-curable pressure-sensitive adhesive so as to facilitate adjusting the relationship between the peel strength X and the peel strength Y. The ultraviolet-curable pressure-sensitive adhesive can be increased in the crosslinking degree by the irradiation with an ultraviolet ray to readily reduce its pressure-sensitive adhesive force. By irradiating the second pressure-sensitive adhesive layer composed of the ultraviolet-curable pressure-sensitive adhesive with an ultraviolet ray, easy separation from the film for semiconductor back surface can be realized.

From the standpoint of, for example, cleaning or cleansing a contamination-averse electronic component such as semiconductor wafer with ultrapure water or an organic solvent such as alcohol, the second pressure-sensitive adhesive layer 32b is preferably an acrylic pressure-sensitive adhesive using an acrylic polymer as the base polymer. The acrylic polymer is not particularly limited but is preferably an acryl polymer formed of a monomer composition containing 50 wt % or more of an acrylic acid ester represented by $CH_2=CHCOOR$ (wherein R is an alkyl group having a carbon number of 6 to 10) and from 1 to 30 wt % of a hydroxyl group-containing monomer and containing no carboxyl group-containing monomer (hereinafter, sometimes referred to as an "acryl polymer A").

As the second pressure-sensitive adhesive layer 32b, a pressure-sensitive adhesive containing the acryl polymer A as the base polymer or polymer main component is preferably used. In the acryl polymer A, as described above, an acrylic acid alkyl ester (alkyl acrylate) represented by the chemical formula: $CH_2=CHCOOR$ (wherein R is an alkyl group having a carbon number of 6 to 10) (sometimes referred to as an "C6-10 alkyl acrylate" or "acrylic acid C6-10 alkyl ester") is used as the main monomer component. As for the alkyl acrylate, if an alkyl acrylate with the alkyl group having a carbon number of less than 6 is used as the main monomer component, the peel strength becomes too small and the picking-up property is sometimes impaired, whereas if an alkyl acrylate with the alkyl group having a carbon number of more than 10 is used as the main monomer component, the adhesion or adherence to the film for semiconductor back surface is reduced, as a result, chip flying may occur during dicing.

Specific examples of the C6-10 alkyl acrylate include hexyl acrylate, heptyl acrylate, octyl acrylate, isooctyl acrylate, 2-ethylhexyl acrylate, nonyl acrylate, isononyl acrylate, decyl acrylate, and isodecyl acrylate. The C6-10 alkyl acrylate is preferably an alkyl acrylate with the alkyl group having a carbon number of 8 to 9, more preferably 2-ethylhexyl acrylate or isooctyl acrylate. One of C6-10 alkyl acrylates may be used alone, or two or more thereof may be used in combination.

The content of the C6-10 alkyl acrylate is preferably 50 wt % or more, more preferably from 70 to 90 wt %, based on the total amount of monomer components of the acryl polymer A. If the content of the C6-10 alkyl acrylate is less than 50 wt % based on the total amount of monomer components, the peel strength becomes too large and the picking-up property is impaired.

As the acryl polymer A, an acrylic acid ester other than the C6-10 alkyl acrylate may be used as the monomer component. Examples of such an acrylic acid ester include, in addition to an alkyl acrylate other than the C6-10 alkyl acrylate (hereinafter, sometimes referred to as "other alkyl acrylate"), an aromatic ring-containing acrylic acid ester (for example, an aryl acrylate such as phenyl acrylate), and an alicyclic hydrocarbon group-containing acrylic acid ester (for example, an cycloalkyl acrylate such as cyclopentyl acrylate and cyclohexyl acrylate, and an isobornyl acrylate). Among these, other alkyl acrylate and cycloalkyl acrylate are preferred, and other alkyl acrylate is more preferred. One of these acrylic acid esters may be used alone, or two or more thereof may be used in combination.

Examples of such other alkyl acrylate include an alkyl acrylate with the alkyl group having a carbon number of 5 or less, such as methyl acrylate, ethyl acrylate, propyl acrylate, isopropyl acrylate, butyl acrylate, isobutyl acrylate, s-butyl acrylate, tert-butyl acrylate, pentyl acrylate and isopentyl acrylate; and an alkyl acrylate with the alkyl group having a carbon number of 11 or more (preferably from 11 to 30), such as undecyl acrylate, dodecyl acrylate, tridecyl acrylate, tetradecyl acrylate, hexadecyl acrylate, octadecyl acrylate and eicosyl acrylate.

In the alkyl acrylate such as C6-10 alkyl acrylate, the alkyl group constituting the ester moiety may be an alkyl group in either linear or branched form.

In the present invention, the acryl polymer A contains a hydroxyl group-containing monomer copolymerizable with the C6-10 alkyl acrylate. Examples of the hydroxyl group-containing monomer include 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth) acrylate, 10-hydroxydecyl(meth)acrylate, 12-hydroxylauryl (meth)acrylate, and (4-hydroxymethylcyclohexyl)methyl (meth)acrylate. One of these hydroxyl group-containing monomers may be used alone, or two or more thereof may be used in combination.

The content of the hydroxyl group-containing monomer is preferably from 1 to 30 wt %, more preferably from 3 to 10 wt %, based on the total amount of monomer components of the acryl polymer A. If the content of the hydroxyl group-containing monomer is less than the lower limit above based on the total amount of monomer components, the cohesive force of the pressure-sensitive adhesive is reduced and the picking-up property is impaired, whereas if the content of the hydroxyl group-containing monomer exceeds the upper limit above based on the total amount of monomer components, the pressure-sensitive adhesive is increased in the polarity to exhibit high interactivity with the film for semiconductor back surface and in turn, the picking-up property is impaired.

The acryl polymer A may contain, if desired, a unit corresponding to another monomer component copolymerizable with the C6-10 alkyl acrylate or hydroxyl group-containing monomer (sometimes referred to as an "another copolymerizable monomer component"). However, in the present invention, a carboxyl group-containing monomer is preferably not used. If a carboxyl group-containing monomer is used, the carboxyl group reacts with an epoxy group in the epoxy resin of the film for semiconductor back surface, and this may cause increase in the adhesion of the second pressure-sensitive adhesive layer to the film for semiconductor back surface and in turn, impair easy releasability between these two members Examples of such a carboxyl group-containing monomer include acrylic acid, methacrylic acid, carboxyethyl (meth) acrylate, carboxypentyl(meth)acrylate, itaconic acid, maleic acid, fumaric acid, and crotonic acid.

Examples of another copolymerizable monomer component include a methacrylic acid ester such as methyl methacrylate, ethyl methacrylate, propyl methacrylate, isopropyl methacrylate, butyl methacrylate, isobutyl methacrylate, s-butyl methacrylate and tert-butyl methacrylate; an acid anhydride monomer such as maleic anhydride and itaconic anhydride; a sulfonic acid group-containing monomer such as styrenesulfonic acid, allylsulfonic acid, 2-(meth)acrylamido-2-methylpropanesulfonic acid, (meth)acrylamidopropanesulfonic acid, sulfopropyl(meth)acrylate and (meth) acryloyloxynaphthalenesulfonic acid; a phosphoric acid group-containing monomer such as 2-hydroxyethylacryloyl phosphate; a styrene-based monomer such as styrene, vinyltoluene and α-methylstyrene; olefins or dienes such as ethylene, butadiene, isoprene and isobutylene; a halogen atom-containing monomer such as vinyl chloride; a fluorine atom-containing monomer such as fluorine (meth)acrylate; acrylamide, and acrylonitrile.

As for the another copolymerizable monomer component, one component or two or more components may be used. The amount used of this copolymerizable monomer is preferably 40 wt % or less based on all monomer components of the acryl polymer A.

The acryl polymer A is obtained by polymerizing a single monomer or a mixture of two or more monomers selected from those described above. The polymerization may be performed in any system such as solution polymerization (e.g., radical polymerization, anionic polymerization, cationic polymerization), emulsion polymerization, bulk polymerization, suspension polymerization and photopolymerization (e.g., ultraviolet (UV) polymerization).

From the standpoint of preventing contamination of a clean semiconductor chip, the content of low molecular weight substances is preferably small. For this reason, the weight average molecular weight of the acryl polymer A is preferably from 350,000 to 1,000,000, more preferably on the order of 450,000 to 800,000. Incidentally, the weight average molecular weight and the number average molecular weight are determined using a value in terms of polystyrene by gel permeation chromatography.

In the second pressure-sensitive adhesive layer, for increasing the number average molecular weight of the acrylic polymer or the like as the base polymer, an external crosslinking agent may be appropriately employed. Specific means for the external crosslinking method include a method of adding a so-called crosslinking agent such as polyisocyanate compound, epoxy compound, aziridine compound and melamine-based crosslinking agent, and causing a reaction. In the case of using an external crosslinking agent, the amount used thereof is appropriately determined by the balance with the base polymer to be crosslinked and further by the use/ application as a pressure-sensitive adhesive. In general, the external crosslinking agent is blended in a ratio of about 10 parts by weight or less, preferably from 0.1 to 8 parts by weight, per 100 parts by weight of the base polymer. Furthermore, in addition to the above-described components, various conventionally known additives such as tackifier and anti-aging agent may be used in the pressure-sensitive adhesive, if desired.

Examples of the ultraviolet-curable monomer component which can be blended in the ultraviolet-curable pressure-sensitive adhesive include urethane oligomer, urethane (meth)acrylate, trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxy-penta(meth)acrylate, dipentaerythritol hexa(meth)acrylate, and 1,4-butanediol di(meth)acrylate. Also, the ultraviolet-curable oligomer component includes various oligomers such as urethane-based, polyether-based, polyester-based, polycarbonate-based and polybutadiene-based oligomers, and an oligomer having a molecular weight of approximately from 100 to 30,000 or so is preferred. The blending amount of the ultraviolet-curable monomer component or oligomer component may be appropriately determined according to the kind of the second pressure-sensitive adhesive layer by taking into consideration the amount capable of decreasing the pressure-sensitive adhesive strength of the second pressure-sensitive adhesive layer. The blending amount is generally, for example, from 5 to 500 parts by weight, preferably on the order of 40 to 150 parts by weight, per 100 parts by weight of the base polymer such as acryl polymer constituting the pressure sensitive adhesive.

As described above, other than the addition-type ultraviolet-curable pressure-sensitive adhesive where an ultraviolet-curable monomer or oligomer component is added, the ultraviolet-curable pressure-sensitive adhesive includes an internal-type ultraviolet-curable pressure-sensitive adhesive using, as the base polymer, a polymer having a carbon-carbon double bond in the polymer side or main chain or at the terminal of the main chain. The internal-type ultraviolet-curable pressure-sensitive adhesive is preferred, because an oligomer component or the like as a low molecular weight component need not be contained or if contained, its content is low and the second pressure-sensitive adhesive layer having a stable layer structure can be formed without allowing an oligomer component or the like to migrate in the pressure-sensitive adhesive with aging.

As the base polymer having a carbon-carbon double bond, those having a carbon-carbon double bond and having a pressure-sensitive adhesive property can be used without any particular limitation. This base polymer is preferably a polymer whose basic framework is an acrylic polymer. The acrylic polymer as the basic framework includes the acrylic polymers illustrated above.

The method for introducing a carbon-carbon double bond into the acrylic polymer is not particularly limited, and various methods may be employed, but in view of molecular design, it is easy to introduce the carbon-carbon double bond into the polymer side chain. Examples thereof include a method of previously copolymerizing a functional group-containing monomer with the acrylic polymer and then performing a condensation or addition reaction to fuse or add a compound having another functional group capable of reacting with the functional group above and having a carbon-carbon double bond, while maintaining the ultraviolet curability of the carbon-carbon double bond.

Examples of the combination of functional groups capable of a condensation or addition reaction include a carboxylic acid group and an epoxy group, a carboxylic acid group and an aziridinyl group, and a hydroxyl group and an isocyanate group. Among these combinations of functional groups, the combination of a hydroxyl group and an isocyanate group is preferred in view of easiness of reaction tracing. As long as the combination of functional groups is a combination capable of producing the acrylic polymer having a carbon-carbon double bond, the functional group may be present on either side of the acrylic polymer or the compound above, but in the case of the above-described preferred combination, it is preferred that the acrylic polymer has a hydroxyl group and the compound has an isocyanate group. In this case, examples of the isocyanate compound having a carbon-carbon double bond include methacryloyl isocyanate, 2-methacryloyloxyethyl isocyanate, and m-isopropenyl-α,α-dimethylbenzyl isocyanate. Also, as the acrylic polymer, an acrylic polymer having copolymerized therein, for example, the above-described hydroxyl group-containing monomer or an ether-based compound such as 2-hydroxyethyl vinyl ether, 4-hydroxybutyl vinyl ether and diethylene glycol monovinyl ether, is used.

As the internal-type ultraviolet-curable pressure-sensitive adhesive, the above-described base polymer (particularly acrylic polymer) having a carbon-carbon double bond may be used alone, but an ultraviolet-curable curable monomer component or oligomer component described above may be also blended to such an extent as not impairing the properties. The content of the ultraviolet-curable oligomer component or the like is usually 30 parts by weight or less, preferably from 0 to 10 parts by weight, per 100 parts by weight of the base polymer.

In the case of curing the ultraviolet-curable pressure-sensitive adhesive with an ultraviolet ray or the like, a photopolymerization initiator is contained therein. Examples of the photopolymerization initiator include an α-ketol-based compound such as 4-(2-hydroxyethoxy)phenyl(2-hydroxy-2-propyl)ketone, α-hydroxy-α,α'-dimethylacetophenone, 2-methyl-2-hydroxypropiophenone and 1-hydroxycyclohexyl phenyl ketone; an acetophenone-based compound such as methoxyacetophenone, 2,2-dimethoxy-2-phenylacetophenone, 2,2-diethoxyacetophenone and 2-methyl-1-[4-(methylthio)-phenyl]-2-morpholinopropane-1; a benzoin ether-based compound such as benzoin ethyl ether, benzoin isopropyl ether and anisoin methyl ether; a ketal-based compound such as benzyl dimethyl ketal; an aromatic sulfonyl chloride-based compound such as 2-naphthalenesulfonyl chloride; a photoactive oxime-based compound such as 1-phenone-1,1-propanedione-2-(o-ethoxycarbonyl)oxime; a benzophenone-based compound such as benzophenone, benzoylbenzoic acid and 3,3'-dimethyl-4-methoxybenzophenone; a thioxanthone-based compound such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone and 2,4-diisopropylthioxanthone; camphorquinone; a halogenated ketone; acylphosphonoxide; and acylphosphonate. The blending amount of the photopolymerization initiator is, for example, approximately from 0.05 to 20 parts by weight per 100 parts by weight of the base polymer such as acrylic polymer constituting the pressure-sensitive adhesive of the second pressure-sensitive adhesive layer.

Other examples of the ultraviolet-curable pressure-sensitive adhesive include an acrylic pressure-sensitive adhesive disclosed in JP-A-60-196956 (herein incorporated by reference), that contains an addition-polymerizable compound having two or more unsaturated bonds, a photopolymerizable compound such as epoxy group-containing alkoxysilane, and a photopolymerization initiator such as carbonyl compound, organic sulfur compound, peroxide, amine and onium salt-based compound.

In the case where curing inhibition by oxygen occurs at the irradiation with an ultraviolet ray, oxygen (air) is preferably blocked from the surface of the ultraviolet-curable second pressure-sensitive adhesive layer 32b. Examples of the method therefor include a method of covering the surface of the second pressure-sensitive adhesive layer 32b with a separator, and a method of performing irradiation with an ultraviolet ray or the like in a nitrogen gas atmosphere.

The thickness of the second pressure-sensitive adhesive layer is not particularly limited but from the standpoint of preventing chipping of the chip cut face, fixing/holding the film for semiconductor back surface, and reducing the cutting debris, the thickness is preferably on the order of 10 to 100 μm, more preferably from 15 to 80 μm, still more preferably from 20 to 50 μm. Incidentally, the second pressure-sensitive adhesive layer may be either a single layer or a multilayer.

As for the modulus of the second pressure-sensitive adhesive layer, the modulus at 23 to 150° C. is preferably from $5 \times 10^4$ to $1 \times 10^{10}$ Pa. The modulus of the second pressure-sensitive adhesive layer is measured on a dynamic viscoelasticity measuring apparatus, "ARES", manufactured by Rheometrics Co., Ltd. with a sample thickness of about 1.5 mm by using a 7.9 mm-diameter parallel plate jig in a shear mode at a frequency of 1 Hz, a temperature rise rate of 5° C./min, and a distortion of 0.1% (23° C.) or 0.3% (150° C.), and taken as the value of shear storage modulus G' obtained at 23° C. or 150° C.

Also, the surface free energy of the surface of the second pressure-sensitive adhesive layer 32b on which the film 2 for semiconductor back surface is to be formed (particularly, the surface in the site with which the film 2 for semiconductor back surface comes into contact) is preferably 30 mJ/m$^2$ or less (for example, from 1 to 30 mJ/m$^2$), more preferably from 15 to 30 mJ/m$^2$, still more preferably from 20 to 28 mJ/m$^2$. If the surface free energy of the second pressure-sensitive adhesive layer 32b exceeds 30 mJ/m$^2$, the adhesion between the second pressure-sensitive adhesive layer 32b and the film 2 for semiconductor back surface is increased and the picking-up property may be impaired.

Incidentally, the surface free energy of the second pressure-sensitive adhesive layer as used in the present invention means a surface free energy value (γs) determined by measuring the contact angle [θ(rad)] of each of water and methylene iodide dropped on the surface of the second pressure-sensitive adhesive layer, and solving two equations as simultaneous linear equations obtained utilizing the measured values, the values known in literatures as a surface free energy value of the contact angle measurement liquid {water [dispersion component ($\gamma L^d$): 21.8 (mJ/m$^2$), polar component ($\gamma L^p$): 51.0 (mJ/m$^2$)], methylene iodide [dispersion component ($\gamma L^d$): 49.5 (mJ/m$^2$), polar component ($\gamma L^p$): 1.3 (mJ/m$^2$)]}, and the following formulae (1a) to (1c).

$$\gamma s = \gamma s^d + \gamma s^p \quad (1a)$$

$$\gamma L = \gamma L^d + \gamma L^p \quad (1b)$$

$$(1+\cos\theta)\gamma L = 2(\gamma s^d \gamma L^d)^{1/2} + 2(\gamma s^p \gamma L^p)^{1/2} \quad (1c)$$

In formulae (1a) to (1c), the symbols indicate the followings:

θ: contact angle (rad) measured by dropping water or methylene iodide,

γs: surface free energy (mJ/m$^2$) of the second pressure-sensitive adhesive layer, $\gamma s^d$: dispersion component (mJ/m$^2$) in the surface free energy of the second pressure-sensitive adhesive layer, $\gamma s^p$: polar component (mJ/m$^2$) in the surface free energy of the second pressure-sensitive adhesive layer, γL: surface free energy (mJ/m$^2$) of water or methylene iodide, $\gamma L^d$: dispersion component (mJ/m$^2$) in the surface free energy of water or methylene iodide, and $\gamma L^p$: polar component (mJ/m$^2$) in the surface free energy of water or methylene iodide.

In the measurement of contact angle of water or methylene iodide for the surface of the second pressure-sensitive adhesive layer, a liquid droplet of about 1 μl of water (distilled water) or methylene iodide was dropped on the second pressure-sensitive adhesive layer surface in an environment of the test place (temperature: 23±2° C., humidity: 50±5% RH) described in JIS Z 8703 and at 30 seconds after dropping, the contact angle was measured using a surface contact angle meter, "CA-X" (manufactured by FACE), by a three-point method.

In the present invention, the second pressure-sensitive adhesive layer may contain various additives (for example, a colorant, a thickener, an extender, a filler, a tackifier, a plasticizer, an anti-aging agent, an antioxidant, a surfactant, and a crosslinking agent) within the range not impairing the effects of the present invention.

Each of the first pressure-sensitive adhesive layer 32a and the second pressure-sensitive adhesive layer 32b can be formed, for example, by a commonly employed method of mixing a pressure-sensitive adhesive with, if desired, a solvent and other additives and then shaping the mixture into a sheet-like layer. Specifically, for example, in the case of forming the first pressure-sensitive adhesive layer 32a, the first pressure-sensitive adhesive layer 32a can be formed, for example, by a method of coating a mixture containing a pressure-sensitive adhesive and, if desired, a solvent and other additives on a base material 31, or a method of coating the mixture above on an appropriate separator (such as release paper) to form a first pressure-sensitive adhesive layer 32a and then transferring (transcribing) it on a base material 31. The second pressure-sensitive adhesive layer 32b can be also formed in accordance with the forming method of the first pressure-sensitive adhesive layer 32a. In the case of performing irradiation with an ultraviolet ray to form the second pressure-sensitive adhesive layer 32b, the irradiation conditions are not particularly limited as long as the desired peel strength X can be achieved, but the irradiation dose is preferably from 50 to 1,000 mJ/cm$^2$, more preferably from 100 to 500 mJ/cm$^2$.

Incidentally, in the invention, the dicing tape-integrated film 1 for semiconductor back surface can be made to have an antistatic function. Owing to this configuration, the circuit can be prevented from breaking down due to the generation of electrostatic energy at the time adhesion and at the time of peeling thereof or due to charging of a semiconductor wafer or the like by the electrostatic energy. Imparting of the antistatic function can be performed by an appropriate manner such as a method of adding an antistatic agent or a conductive substance to the base material 31, the pressure-sensitive adhesive layer 32, and the film 2 for semiconductor back surface, or a method of providing a conductive layer composed of a charge-transfer complex, a metal film, or the like onto the base material 31. As these methods, a method in which an impurity ion having a fear of changing quality of the semiconductor wafer is difficult to generate is preferable. Examples of the conductive substance (conductive filler) to be blended for the purpose of imparting conductivity, improving thermal conductivity, and the like include a sphere-shaped, a needle-shaped, or a flake-shaped metal powder of silver, aluminum, gold, copper, nickel, a conductive alloy, or the like; a metal oxide such as alumina; amorphous carbon black, and graphite. However, the film 2 for semiconductor back surface is preferably non-conductive from the viewpoint of having no electric leakage.

Moreover, the dicing tape-integrated film 1 for semiconductor back surface may be formed in a form where it is wound as a roll or may be formed in a form where the sheet (film) is laminated. For example, in the case where the film has the form where it is wound as a roll, the film is wound as a roll in a state that the laminate of the film 2 for semiconductor back surface and the dicing tape 3 is protected by a separator according to needs, whereby the film can be prepared as a dicing tape-integrated film 1 for semiconductor back surface in a state or form where it is wound as a roll. In this regard, the dicing tape-integrated film 1 for semiconductor back surface in the state or form where it is wound as a roll may be constituted by the base material 31, the pressure-sensitive adhesive layer 32 formed on one surface of the base material 31, the film 2 for semiconductor back surface formed on the pressure-sensitive adhesive layer 32, and a releasably treated layer (rear surface treated layer) formed on the other surface of the base material 31.

Incidentally, the thickness of the dicing tape-integrated film 1 for semiconductor back surface (total thickness of the thickness of the film for semiconductor back surface and the thickness of the dicing tape including the base material 31 and the pressure-sensitive adhesive layer 32) can be, for example, selected from the range of 8 µm to 1,500 µm, and it is preferably from 20 µm to 850 µm, more preferably 31 µm to 500 µm, and particularly preferably 47 µm to 330 µm.

In this regard, in the dicing tape-integrated film 1 for semiconductor back surface, by controlling the ratio of the thickness of the film 2 for semiconductor back surface to the thickness of the pressure-sensitive adhesive layer 32 of the dicing tape 3 or the ratio of the thickness of the film 2 for semiconductor back surface to the thickness of the dicing tape (total thickness of the base material 31 and the pressure-sensitive adhesive layer 32), a dicing property at the dicing step, a picking-up property at the picking-up step, and the like can be improved and the dicing tape-integrated film 1 for semiconductor back surface can be effectively utilized from the dicing step of the semiconductor wafer to the flip chip bonding step of the semiconductor chip.

(Producing Method of Dicing Tape-Integrated Film for Semiconductor Back Surface)

The producing method of the dicing tape-integrated film for semiconductor back surface according to the present embodiment is described while using the dicing tape-integrated film 1 for semiconductor back surface shown in FIG. 1 as an example. First, the base material 31 can be formed by a conventionally known film-forming method. Examples of the film-forming method include a calendar film-forming method, a casting method in an organic solvent, an inflation extrusion method in a closely sealed system, a T-die extrusion method, a co-extrusion method, and a dry laminating method.

Next, a pressure-sensitive adhesive composition is coated on the base material 31 and dried (if desired, crosslinked by heating) to form a first pressure-sensitive adhesive layer 32*a*. Examples of the coating system include roll coating, screen coating and gravure coating. Incidentally, the pressure-sensitive adhesive composition may be directly coated on the base material 31 to form the first pressure-sensitive adhesive layer 32*a* on the base material 31, or after forming the first pressure-sensitive adhesive layer 32*a* by coating the pressure-sensitive adhesive composition on release paper or the like with the surface being release-treated, the first pressure-sensitive adhesive layer 32*a* may be transferred onto the base material 31. A second pressure-sensitive adhesive layer 32*b* is formed on the first pressure-sensitive adhesive layer 32*a* by repeating the same procedure, whereby a dicing tape 3 having a pressure-sensitive adhesive layer 32 formed on a base material 31 can be produced.

On the other hand, a forming material for forming the film 2 for semiconductor back surface is applied onto a release sheet to form a coating layer having a predetermined thickness after dried, and then dried under a predetermined condition (optionally heated in case where thermal curing is necessary, and dried) to form the coating layer. The coating layer is transferred onto the pressure-sensitive adhesive layer 32 (second pressure-sensitive adhesive layer 32*b*) to thereby form the film 2 for semiconductor back surface on the pressure-sensitive adhesive layer 32. The film 2 for semiconductor back surface may also be formed on the pressure-sensitive adhesive layer 32 by directly applying the forming material for forming the film 2 for semiconductor back surface onto the pressure-sensitive adhesive layer 32 and then drying it under a predetermined condition (optionally heating it in case where thermal curing is necessary, and drying it). According to the process as above, the dicing tape-integrated film 1 for semiconductor back surface of the invention can be obtained. In case where thermal curing is needed in forming the film 2 for semiconductor back surface, it is important that the thermal curing is effected to such a degree that the coating layer could be partially cured, but preferably, the coating layer is not thermally cured.

The dicing tape-integrated film 1 for semiconductor back surface of the invention can be suitably used at the production of a semiconductor device including the flip chip connection step. Namely, the dicing tape-integrated film 1 for semiconductor back surface of the invention is used at the production of a flip chip-mounted semiconductor device and thus the flip chip-mounted semiconductor device is produced in a condition or form where the film 2 for semiconductor back surface of the dicing tape-integrated film 1 for semiconductor back surface is attached to the back surface of the semiconductor chip. Therefore, the dicing tape-integrated film 1 for semiconductor back surface of the invention can be used for a flip chip-mounted semiconductor device (a semiconductor device in a state or form where the semiconductor chip is fixed to an adherend such as a substrate by a flip chip bonding method).

The film 2 for semiconductor back surface is usable also for flip chip-mounted semiconductor devices (semiconductor devices in a state or form where a semiconductor chip is fixed to the adherend such as a substrate or the like in a flip chip bonding method), like in the dicing tape-integrated film 1 for semiconductor back surface.

(Semiconductor Wafer)

The semiconductor wafer is not particularly restricted as long as it is a known or commonly used semiconductor wafer and can be appropriately selected and used among semiconductor wafers made of various materials. In the invention, as the semiconductor wafer, a silicon wafer can be suitable used.

(Manufacturing Method of Semiconductor Device)

The manufacturing method of a semiconductor device according to this embodiment is described below by referring to FIGS. 2A to 2D. FIGS. 2A to 2D are schematic cross-sectional views showing the manufacturing method of a semiconductor device when the above-described dicing tape-integrated film 1 for semiconductor back surface is used. In FIGS. 2A to 2D, for simplification, the first pressure-sensitive adhesive layer and the second pressure-sensitive adhesive layer are collectively shown as the pressure-sensitive adhesive layer.

The manufacturing method of a semiconductor device can produce a semiconductor device by using the above-described dicing tape-integrated film 1 for semiconductor back surface. Specifically, the manufacturing method comprises a step of attaching a semiconductor wafer onto the film for semiconductor back surface in the above-described dicing tape-integrated film for semiconductor back surface, a step of dicing the semiconductor wafer to form a semiconductor chip, a step of separating the semiconductor chip together with the film for semiconductor back surface from the pressure-sensitive adhesive layer of the dicing tape, and a step of flip chip-connecting the semiconductor chip onto an adherend.

(Mounting Step)

Figure 2A:
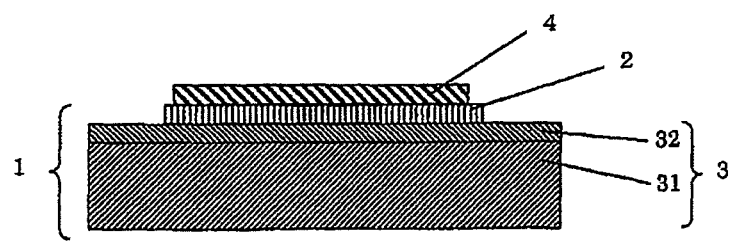
FIGS. 2A to 2D are cross-sectional schematic views showing one embodiment of a process for producing a semiconductor device using a dicing tape-integrated film for semiconductor back surface of the invention.

First, as shown in FIG. 2A, a separator optionally provided on the film 2 for semiconductor back surface of the dicing tape-integrated film 1 for semiconductor back surface is suitably peeled off and the semiconductor wafer 4 is attached onto the film 2 for semiconductor back surface to be fixed by adhesion and holding (mounting step). On this occasion, the film 2 for semiconductor back surface is in an uncured state (including a semi-cured state). Moreover, the dicing tape-integrated film 1 for semiconductor back surface is attached to the back surface of the semiconductor wafer 4. The back surface of the semiconductor wafer 4 means a face opposite to the circuit face (also referred to as non-circuit face, non-electrode-formed face, etc.). The attaching method is not particularly restricted but a method by press bonding is preferred. The press bonding is usually performed while pressing with a pressing means such as a pressing roll.

The conditions in attaching the semiconductor wafer to the film for semiconductor back surface are not particularly, but this is preferably performed at a temperature of 25 to 100° C. and a speed of 1 to 100 mm/sec under a pressure of 0.05 to 1 MPa.

(Dicing Step)

Figure 2B:
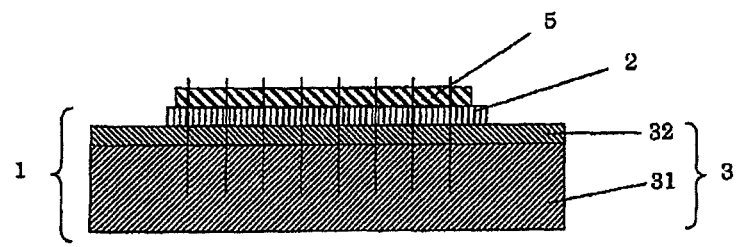

Next, as shown in FIG. 2B, the semiconductor wafer 4 is diced. Thereby, the semiconductor wafer 4 is cut into a prescribed size and individualized (is formed into small pieces) to produce semiconductor chips 5. The dicing is performed according to a normal method from the circuit face side of the semiconductor wafer 4, for example. Moreover, the present step can adopt, for example, a cutting method called full-cut that forms a slit reaching the dicing tape-integrated film 1 for semiconductor back surface. The dicing apparatus used in the present step is not particularly restricted, and a conventionally known apparatus can be used. Further, since the semiconductor wafer 4 is adhered and fixed by the dicing tape-integrated film 1 for semiconductor back surface having the film for semiconductor back surface, chip crack and chip fly can be suppressed, as well as the damage of the semiconductor wafer 4 can also be suppressed. In this regard, when the film 2 for semiconductor back surface is formed of a resin composition containing an epoxy resin, generation of adhesive extrusion from the adhesive layer of the film for semiconductor back surface can be suppressed or prevented at the cut surface even when it is cut by dicing. As a result, re-attachment (blocking) of the cut surfaces themselves can be suppressed or prevented and thus the picking-up to be mentioned below can be further conveniently performed.

As for the depth to which the cut is executed by a dicing blade, in the case of full cut of the semiconductor wafer, the cut is preferably performed to a depth of the second pressure-sensitive adhesive layer 32b. If the cut is executed to a depth deeper than the second pressure-sensitive adhesive layer 32b, beards or burrs are generated during dicing and may cause contamination of the device chip.

In the case where the dicing tape-integrated film 1 for semiconductor back surface is expanded, the expansion can be performed using a conventionally known expanding apparatus. The expanding apparatus has a doughnut-shaped outer ring capable of pushing the dicing tape-integrated film 1 for semiconductor back surface downward through a dicing ring and an inner ring which has a diameter smaller than the outer ring and supports the dicing tape-integrated film for semiconductor back surface. Owing to the expanding step, it is possible to prevent the damage of adjacent semiconductor chips through contact with each other in the picking-up step to be mentioned below.

(Picking-Up Step)

Figure 2C:
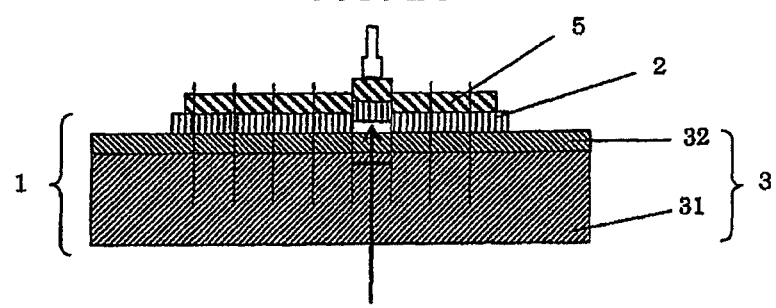

In order to collect the semiconductor chip 5 that is adhered and fixed to the dicing tape-integrated film 1 for semiconductor back surface, picking-up of the semiconductor chip 5 is performed as shown in FIG. 2C to peel the semiconductor chip 5 together with the film 2 for semiconductor back surface from the dicing tape 3. The method of picking-up is not particularly restricted, and conventionally known various methods can be adopted. For example, there may be mentioned a method including pushing up each semiconductor chip 5 from the base material 31 side of the dicing tape-integrated film 1 for semiconductor back surface with a needle and picking-up the pushed semiconductor chip 5 with a picking-up apparatus. In this regard, the back surface of the picked-up semiconductor chip 5 is protected with the film 2 for semiconductor back surface.

(Flip Chip Connection Step)

Figure 2D:
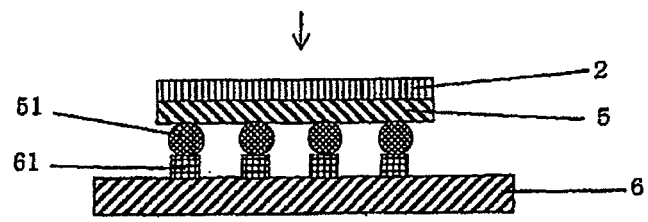

The picked-up semiconductor chip 5 is fixed to an adherend 6 such as a substrate by a flip chip bonding method (flip chip mounting method) as shown in FIG. 2D. Specifically, the semiconductor chip 5 is fixed to the adherend 6 according to a usual manner in a form where the circuit face (also referred to as a front face, circuit pattern-formed face, electrode-formed face, etc.) of the semiconductor chip 5 is opposed to the adherend 6. For example, the bump 51 formed at the circuit face side of the semiconductor chip 5 is brought into contact with a conductive material 61 (such as solder) for conjuction attached to a connecting pad of the adherend 6 and the conductive material 61 is melted under pressing, whereby electric connection between the semiconductor chip 5 and the adherend 6 can be secured and the semiconductor chip 5 can be fixed to the adherend 6 (flip chip bonding step). On this occasion, gaps are formed between the semiconductor chip 5 and the adherend 6 and the distance between the gaps is generally about 30 μm to 300 μM. In this regard, after the flip chip bonding (flip chip connecting) of the semiconductor chip 5 on the adherend 6, it is important that the opposing faces of the semiconductor chip 5 and the adherend 6 and the gaps are washed and an encapsulating material (such as an encapsulating resin) is then filled into the gaps to perform encapsulation.

As the adherend 6, various substrates such as lead frames and circuit boards (such as wiring circuit boards) can be used. The material of the substrates is not particularly restricted and there may be mentioned ceramic substrates and plastic substrates. Examples of the plastic substrates include epoxy substrates, bismaleimide triazine substrates, and polyimide substrates.

In the flip chip bonding step, the material of the bump and the conductive material is not particularly restricted and examples thereof include solders (alloys) such as tin-lead-based metal materials, tin-silver-based metal materials, tin-silver-copper-based metal materials, tin-zinc-based metal materials, and tin-zinc-bismuth-based metal materials, and gold-based metal materials and copper-based metal materials.

Incidentally, in the flip chip bonding step, the conductive material is melted to connect the bump at the circuit face side of the semiconductor chip 5 and the conductive material on the surface of the adherend 6. The temperature at the melting of the conductive material is usually about 260° C. (e.g., 250° C. to 300° C.). The dicing tape-integrated film for semiconductor back surface of the invention can be made to have thermal resistance capable of enduring the high temperature in the flip chip bonding step by forming the film for semiconductor back surface with an epoxy resin or the like.

In the present step, it is preferred to wash the opposing face (electrode-formed face) between the semiconductor chip 5 and the adherend 6 and the gaps. The washing liquid to be used at the washing is not particularly restricted and examples thereof include organic washing liquids and aqueous washing liquids. The film for semiconductor back surface in the dicing tape-integrated film for semiconductor back surface of the invention has solvent resistance against the washing liquid and has substantially no solubility to these washing liquid. Therefore, as mentioned above, various washing liquids can be employed as the washing liquid and the washing can be achieved by any conventional method without requiring any special washing liquid.

Next, an encapsulation step is performed for encapsulating the gaps between the flip chip-bonded semiconductor chip 5 and the adherend 6. The encapsulation step is performed using an encapsulating resin. The encapsulation conditions on this occasion are not particularly restricted but the curing of the encapsulating resin is usually carried out at 175° C. for 60 seconds to 90 seconds. However, in the invention, without limitation thereto, the curing may be performed at a temperature of 165 to 185° C. for several minutes, for example. By the thermal treatment in this step, not only the encapsulating resin but also the film 2 for semiconductor back surface is also thermally cured at the same time. Accordingly, both the encapsulating resin and the film 2 for semiconductor back surface are cured and shrunk with the procedure of the thermal curing. As a result, the stress to be given to the semiconductor chip 5 owing to the curing shrinkage of the encapsulating resin can be cancelled or relaxed through curing shrinkage of the film 2 for semiconductor back surface. Moreover, in this step, the film 2 for semiconductor back surface can be completely or almost completely thermally cured and can be attached to the back surface of the semiconductor element with excellent close adhesiveness. Further, the film 2 for semiconductor back surface according to the invention can be thermally cured together with the encapsulating material in the encapsulation step even when the film is in an uncured state, so that it is not necessary to newly add a step for thermal curing of the film 2 for semiconductor back surface.

The encapsulating resin is not particularly restricted as long as the material is a resin having an insulating property (an insulating resin) and may be suitably selected and used among known encapsulating materials such as encapsulating resins. The encapsulating resin is preferably an insulating resin having elasticity. Examples of the encapsulating resin include resin compositions containing an epoxy resin. As the epoxy resin, there may be mentioned the epoxy resins exemplified in the above. Furthermore, the encapsulating resin composed of the resin composition containing an epoxy resin may contain a thermosetting resin other than an epoxy resin (such as a phenol resin) or a thermoplastic resin in addition to the epoxy resin. Incidentally, a phenol resin can be utilized also as a curing agent for the epoxy resin and, as such a phenol resin, there may be mentioned phenol resins exemplified in the above.

According to the semiconductor device (flip chip-mounted semiconductor device) manufactured using the dicing tape-integrated film 1 for semiconductor back surface, the film for semiconductor back surface is attached to the back surface of the semiconductor chip, and therefore, laser marking can be applied with excellent visibility. In particular, even when the marking method is a laser marking method, laser marking can be applied with an excellent contrast ratio, and it is possible to observe various kinds of information (for example, literal information and graphical information) applied by laser marking with good visibility. At the laser marking, a known laser marking apparatus can be utilized. Moreover, as the laser, it is possible to utilize various lasers such as a gas laser, a solid-state laser, and a liquid laser. Specifically, as the gas laser, any known gas lasers can be utilized without particular limitation but a carbon dioxide laser ($CO_2$ laser) and an excimer laser (ArF laser, KrF laser, XeCl laser, XeF laser, etc.) are suitable. As the solid-state laser, any known solid-state lasers can be utilized without particular limitation but a YAG laser (such as Nd:YAG laser) and a $YVO_4$ laser are suitable.

Since the semiconductor device produced using the dicing tape-integrated film 1 for semiconductor back surface or the film 2 for semiconductor back surface of the invention is a semiconductor device mounted by the flip chip mounting method, the device has a thinned and miniaturized shape as compared with a semiconductor device mounted by a die-bonding mounting method. Thus, the semiconductor devices can be suitably employed as various electronic devices and electronic parts or materials and members thereof. Specifically, as the electronic devices in which the flip chip-mounted semiconductor devices of the invention are utilized, there may be mentioned so-called "mobile phones" and "PHS", small-sized computers [e.g., so-called "PDA" (handheld terminals), so-called "notebook-sized personal computer", so-called "Net Book (trademark)", and so-called "wearable computers", etc.], small-sized electronic devices having a form where a "mobile phone" and a computer are integrated, so-called "Digital Camera (trademark)", so-called "digital video cameras", small-sized television sets, small-sized game machines, small-sized digital audio players, so-called "electronic notepads", so-called "electronic dictionary", electronic device terminals for so-called "electronic books", mobile electronic devices (portable electronic devices) such as small-sized digital type watches, and the like. Needless to say, electronic devices (stationary type ones, etc.) other than mobile ones, e.g., so-called "desktop personal computers", thin type television sets, electronic devices for recording and reproduction (hard disk recorders, DVD players, etc.), projectors, micromachines, and the like may be also mentioned. In addition, electronic parts or materials and members for electronic devices and electronic parts are not particularly restricted and examples thereof include parts for so-called "CPU" and members for various memory devices (so-called "memories", hard disks, etc.).

EXAMPLES

The following will illustratively describe preferred Examples of the invention in detail. However, the invention is not limited to the following Examples unless it exceeds the gist thereof. Moreover, part in each example is a weight standard unless otherwise stated.

Example 1

Production of Second Pressure-Sensitive Adhesive Layer

A reaction vessel with a condenser, a nitrogen inlet tube, a thermometer and a stirring device was charged with 80 parts of 2-ethylhexyl acrylate (2EHA), 20 parts of 2-hydroxyethyl acrylate (HEA) and 65 parts of toluene, and a polymerization process was performed at 61° C. for 6 hours in a nitrogen stream to obtain Acrylic Polymer X1.

Thereto, 24.1 parts (90 mol % based on HEA) of 2-methacryloyloxyethyl isocyanate (MOI) was added per 100 parts of Acrylic Polymer X1, and an addition reaction process was performed at 50° C. for 48 hours in an airstream to obtain Acrylic Polymer Y1.

Subsequently, 3 parts of a polyisocyanate compound ("COLONATE L", trade name, produced by Nippon Polyurethane Industry Co., Ltd.) and 5 parts of a photopolymerization initiator ("IRUGACURE 651", trade name, produced by Ciba Specialty Chemicals) were added per 100 parts of Acrylic Polymer Y1 to prepare a pressure-sensitive adhesive solution.

The pressure-sensitive adhesive solution prepared above was coated on a silicone-treated surface of a 50 μm-thick PET film and crosslinked by heating at 80° C. for 3 minutes to form an active energy ray-curable pressure-sensitive adhesive layer having a thickness of 30 μm which was then irradiated with an ultraviolet ray at an ultraviolet irradiation integrated light quantity of 300 mJ/cm$^2$ by using an ultraviolet (UV) irradiation apparatus ("UM-810", trade name (manufactured by Nitto Seiki Co., Ltd.)) to produce Second Pressure-Sensitive Adhesive Layer A.

<Production of Film for Semiconductor Back Surface>

113 Parts of epoxy resin ("EPICOTE 1004", trade name, produced by JER), 121 parts of phenolic resin ("MILEX XLC-4L", trade name, produced by Mitsui Chemicals, Inc.), 246 parts of spherical silica ("SO-25R", trade name, produced by Admatechs Co., Ltd.), and 3 parts of dye ("OIL BLACK BS" trade name, produced by Orient Chemical Industries Co., Ltd.) were dissolved in methyl ethyl ketone per 100 parts of acrylic acid ester-based polymer ("PARACRON W-197CM", trade name, produced by Negami Chemical Industrial Co., Ltd.) with the main component being ethyl acrylate-methyl methacrylate, to prepare an adhesive composition solution having a solid content concentration of 23.6 wt %.

This adhesive composition solution was coated on a release-treated film as a release liner (separator) composed of a 50 μm-thick polyethylene terephthalate film subjected to a release treatment with silicone, and then dried at 130° C. for 2 minutes to produce Film A for Semiconductor Back Surface having a thickness (average thickness) of 20 μm.

<Production of Dicing Tape-Integrated Film for Semiconductor Back Surface>

As the base material layer and the first pressure-sensitive adhesive layer, S-400X (trade name, produced by Nitto Denko Corporation) was used, and Second Pressure-Sensitive Adhesive Layer A cut out into 315 mm in diameter was attached to the first pressure-sensitive adhesive layer at ordinary temperature. Thereto, Film A for Semiconductor Back Surface cut out into 330 mm in diameter was attached at 40° C. to completely cover Second Pressure-Sensitive Adhesive Layer A, whereby Dicing Tape-Integrated Film A for Semiconductor Back Surface was produced.

Example 2

In Example 2, Dicing Tape-Integrated Film B for Semiconductor Back Surface was produced in the same manner as in Example 1 except for changing the base material and the first pressure-sensitive adhesive layer to CB-700 (trade name, produced by Nitto Denko Corporation).

Example 3

In Example 3, Dicing Tape-Integrated Film C for Semiconductor Back Surface was produced in the same manner as in Example 1 except for changing the base material and the first pressure-sensitive adhesive layer to M-4001 (trade name, produced by Nitto Denko Corporation).

Example 4

In Example 4, Dicing Tape-Integrated Film D for Semiconductor Back Surface was produced in the same manner as in Example 1 except for changing the base material and the first pressure-sensitive adhesive layer to HR-4011 (trade name, produced by Nitto Denko Corporation).

Example 5

In Example 5, Dicing Tape-Integrated Film E for Semiconductor Back Surface was produced in the same manner as in Example 1 except for changing the base material and the first pressure-sensitive adhesive layer to V-8S (trade name, produced by Nitto Denko Corporation).

Example 6

In Example 6, Dicing Tape-Integrated Film F for Semiconductor Back Surface was produced in the same manner as in Example 1 except for changing the base material and the first pressure-sensitive adhesive layer to UE-1088J (trade name, produced by Nitto Denko Corporation).

Example 7

In Example 7, Dicing Tape-Integrated Film G for Semiconductor Back Surface was produced in the same manner as in Example 1 except for changing the base material and the first pressure-sensitive adhesive layer to UB-2130E (trade name, produced by Nitto Denko Corporation).

Example 8

Production of Second Pressure-Sensitive Adhesive Layer

A reaction vessel with a condenser, a nitrogen inlet tube, a thermometer and a stirring device was charged with 80 parts of 2-ethylhexyl acrylate (2EHA), 20 parts of 2-hydroxyethyl acrylate (HEA) and 65 parts of toluene, and a polymerization process was performed at 61° C. for 6 hours in a nitrogen stream to obtain Acrylic Polymer X2.

Thereto, 24.1 parts (90 mol % based on HEA) of 2-methacryloyloxyethyl isocyanate (MOI) was added per 100 parts of Acrylic Polymer X2, and an addition reaction process was performed at 50° C. for 48 hours in an airstream to obtain Acrylic Polymer Y2.

Subsequently, 8 parts of a polyisocyanate compound ("COLONATE L", trade name, produced by Nippon Polyurethane Industry Co., Ltd.) and 5 parts of a photopolymerization initiator ("IRUGACURE 651", trade name, produced by Ciba Specialty Chemicals) were added per 100 parts of Acrylic Polymer Y2 to prepare a pressure-sensitive adhesive solution.

The pressure-sensitive adhesive solution prepared above was coated on a silicone-treated surface of a 50 μm-thick PET film and crosslinked by heating at 80° C. for 3 minutes to form an active energy ray-curable pressure-sensitive adhesive layer having a thickness of 30 μM, which was then irradiated with an ultraviolet ray at an ultraviolet irradiation integrated light quantity of 300 mJ/cm$^2$ by using an ultraviolet (UV) irradiation apparatus ("UM-810", trade name (manufactured by Nitto Seiki Co., Ltd.)) to produce Second Pressure-Sensitive Adhesive Layer B.

<Production of Film for Semiconductor Back Surface>

The production of the film for semiconductor back surface was the same as that in Example 1.

<Production of Dicing Tape-Integrated Film for Semiconductor Back Surface>

As the base material layer and the first pressure-sensitive adhesive layer, S-400X (trade name, produced by Nitto Denko Corporation) was used, and Second Pressure-Sensitive Adhesive Layer B cut out into 315 mm in diameter was attached to the first pressure-sensitive adhesive layer at ordinary temperature. Thereto, Film A for Semiconductor Back Surface cut out into 330 mm in diameter was attached at 40° C. to completely cover Second Pressure-Sensitive Adhesive Layer B, whereby Dicing Tape-Integrated Film H for Semiconductor Back Surface was produced.

Example 9

Production of Second Pressure-Sensitive Adhesive Layer

A reaction vessel with a condenser, a nitrogen inlet tube, a thermometer and a stirring device was charged with 80 parts of 2-ethylhexyl acrylate (2EHA), 20 parts of 2-hydroxyethyl acrylate (HEA) and 65 parts of toluene, and a polymerization process was performed at 61° C. for 6 hours in a nitrogen stream to obtain Acrylic Polymer X3.

Thereto, 24.1 parts (90 mol % based on HEA) of 2-methacryloyloxyethyl isocyanate (MOI) was added per 100 parts of Acrylic Polymer X3, and an addition reaction process was performed at 50° C. for 48 hours in an airstream to obtain Acrylic Polymer Y3.

Subsequently, 5 parts of a polyisocyanate compound ("COLONATE L", trade name, produced by Nippon Polyurethane Industry Co., Ltd.) and 5 parts of a photopolymerization initiator ("IRUGACURE 651", trade name, produced by Ciba Specialty Chemicals) were added per 100 parts of Acrylic Polymer Y3 to prepare a pressure-sensitive adhesive solution.

The pressure-sensitive adhesive solution prepared above was coated on a silicone-treated surface of a 50 μm-thick PET film and crosslinked by heating at 80° C. for 3 minutes to form an active energy ray-curable pressure-sensitive adhesive layer having a thickness of 30 μm, whereby Second Pressure-Sensitive Adhesive Layer C was produced.

<Production of Film for Semiconductor Back Surface>

The production of the film for semiconductor back surface was the same as that in Example 1.

<Production of Dicing Tape-Integrated Film for Semiconductor Back Surface>

As the base material layer and the first pressure-sensitive adhesive layer, S-400X (trade name, produced by Nitto Denko Corporation) was used, and Second Pressure-Sensitive Adhesive Layer C cut out into 315 mm in diameter was attached to the first pressure-sensitive adhesive layer at ordinary temperature. Thereto, Adhesive Layer A cut out into 330 mm in diameter was attached at 40° C. to completely cover Second Pressure-Sensitive Adhesive Layer C, which was then irradiated with an ultraviolet ray at an ultraviolet irradiation integrated light quantity of 300 mJ/cm$^2$ by using an ultraviolet (UV) irradiation apparatus ("UM-810", trade name (manufactured by Nitto Seiki Co., Ltd.)) to produce Dicing Tape-Integrated Film I for Semiconductor Back Surface was produced.

Comparative Example 1

In Comparative Example 1, Dicing Tape-Integrated Film J for Semiconductor Back Surface was produced in the same manner as in Example 1 except for changing the second pressure-sensitive adhesive layer site to OPP film (FBS-6, trade name, produced by Futamura Chemical Co., Ltd.).

Comparative Example 2

In Comparative Example 2, Dicing Tape-Integrated Film K for Semiconductor Back Surface was produced in the same manner as in Example 1 except for changing the second pressure-sensitive adhesive layer site to silicone-treated PE film (40RL-02, trade name, produced by Oji Specialty Paper). Here, the treated surface of the silicone-treated PE film was attached to the surface of the film for semiconductor back surface.

Comparative Example 3

In Comparative Example 3, Dicing Tape-Integrated Film L for Semiconductor Back Surface was produced in the same manner as in Example 1 except for changing the base material and the first pressure-sensitive adhesive layer to R-100 (trade name, produced by Nitto Denko Corporation).

Comparative Example 4

In Comparative Example 4, Dicing Tape-Integrated Film M for Semiconductor Back Surface was produced in the same manner as in Example 1 except for changing the base material and the first pressure-sensitive adhesive layer to R-300 (trade name, produced by Nitto Denko Corporation).

Comparative Example 5

In Comparative Example 5, Dicing Tape-Integrated Film N for Semiconductor Back Surface was produced in the same manner as in Example 1 except for changing the base material and the first pressure-sensitive adhesive layer to N100 (trade name, produced by Nitto Denko Corporation).

Using the obtained dicing tape-integrated films for semiconductor back surface of Examples 1 to 9 and Comparative Examples 1 to 5, the following evaluations were performed. The results are shown in Tables 1 and 2 below.

<Measurement of Peel Strength Between Second Pressure-Sensitive Adhesive Layer and Film for Semiconductor Back Surface>

The produced dicing tape-integrated film for semiconductor back surface was cut into a size of 100×20 mm. Thereafter, the film for semiconductor back surface was reinforced by attaching a tape (BT-315, trade name, produced by Nitto Denko Corporation) to the film for semiconductor back surface at ordinary temperature. The second pressure-sensitive adhesive layer and the film for semiconductor back surface were then subjected to chucking, and the force (maximum load, unit: N/20 mm) when separating the second pressure-sensitive adhesive layer and the film for semiconductor back surface at a peel speed of 300 mm/min and a peel angle of 180° was read using a tensile tester (AGS-J, trade name, manufactured by Shimadzu Corporation).

<Measurement of Peel Strength Between First Pressure-Sensitive Adhesive Layer and Second Pressure-Sensitive Adhesive Layer>

The film for semiconductor back surface was removed from the produced dicing tape-integrated film for semiconductor back surface, and the dicing tape was cut into a size of 100×20 mm. Thereafter, the second pressure-sensitive adhesive layer was reinforced by attaching a tape (BT-315, trade name, produced by Nitto Denko Corporation) to the second pressure-sensitive adhesive layer surface at ordinary temperature. The first pressure-sensitive adhesive layer and the second pressure-sensitive adhesive layer were then subjected to chucking, and the force (maximum load, unit: N/20 mm) when separating the first pressure-sensitive adhesive layer and the second pressure-sensitive adhesive layer at a peel speed of 300 mm/min and a peel angle of 180° was read using a tensile tester (AGS-J, trade name, manufactured by Shimadzu Corporation).

<Measurement of Peel Strength Between SUS and First Pressure-Sensitive Adhesive Layer>

The second pressure-sensitive adhesive layer and the film for semiconductor back surface were removed from the produced dicing tape-integrated film for semiconductor back surface, and the residue was cut into a size of 100×20 mm and then attached to an SUS304BA plate at ordinary temperature by using a 2 kg roller. Thereafter, the first pressure-sensitive adhesive layer and the SUS304BA plate were subjected to chucking, and the force (maximum load, unit: N/20 mm) when separating the first pressure-sensitive adhesive layer and SUS at a peel speed of 300 mm/min and a peel angle of 180° was read using a tensile tester (AGS-J, trade name, manufactured by Shimadzu Corporation).

<Evaluation Method of Chip Contamination/Picking-Up Property at Dicing>

Using each of the dicing tape-integrated films for semiconductor back surface of Examples and Comparative Examples, the chip contamination at dicing was evaluated by actually dicing a semiconductor wafer in the following manner and thereafter, the picking-up property was evaluated, whereby evaluation of chip contamination and picking-up performance of each dicing tape-integrated film for semiconductor back surface was performed.

A mirror wafer having a thickness of 0.050 mm prepared by subjecting an Si mirror wafer (diameter: 12 inches, thickness: 0.6 mm) to a back surface polishing treatment was used as a workpiece. After removing the separator from the dicing tape-integrated film for semiconductor back surface, the mirror wafer (workpiece) was attached onto the film for semiconductor back surface by pressure-bonding under a roll at 70° C., and dicing was further performed. The dicing was performed by full cut to give a chip size of 10 mm square.

Here, the semiconductor wafer grinding conditions, the attaching conditions, the dicing conditions and the picking-up conditions are as follows.

(Semiconductor Wafer Grinding Conditions)

Grinding apparatus: "DGP-8760", trade name, manufactured by DISCO Corporation

Semiconductor wafer: 12 inches in diameter (back surface was ground to a thickness of 0.050 mm from 0.6 mm)

(Attaching Conditions)

Attaching apparatus: "MA-3000II", trade name, manufactured by Nitto Seiki Co., Ltd.

Attaching speed: 10 mm/min

Attaching pressure: 0.15 MPa

Stage temperature during attaching: 40° C.

(Dicing Conditions)

Dicing apparatus: "DFD-6361", trade name, manufactured by DISCO Corporation

Dicing ring: "2-12-1" (manufactured by DISCO Corporation)

Dicing speed: 30 mm/sec

Dicing Blade:

Z1: "NBC-ZH203O-SE 27HCDD" manufactured by DISCO Corporation

Rotation Speed of Dicing Blade:

Z1: 40,000 rpm

Height of Z1 blade: half the height of wafer

Z2: "NBC-ZH103O-SE 27HCBB" manufactured by DISCO Corporation

Rotation Speed of Dicing Blade:

Z2: 45,000 rpm

Height of Z2 blade: center of second pressure-sensitive adhesive layer

Cutting method: step cutting

Wafer chip size: 10.0 mm square (Picking-Up Conditions)

Picking-up apparatus: "SPA-300", trade name, manufactured by Shinkawa Ltd.

Number of needles: 5

Kind of needle: F0.7, 15°, 101, 350 μm

Picking-up speed: 5 mm/sec

Picking-up time: 1,000 msec

Picking-up height (needle push-up amount): an arbitrary height up to 650 μm (Evaluation/Judgment of Chip Contamination at Dicing)

Four corners of each of 20 pieces of chips collected by picking up were observed through a microscope, and the sample was judged as A when the number of burrs or beards attached to the chip side surface was 0, judged as B when from 1 to 10, and judged as C when 11 or more.

(Evaluation/Judgment of Picking-Up Property)

The needle picking-up amount was evaluated as a picking-up height capable of picking up the chip. The sample was judged as A when the needle picking-up height was from 0 to 600 μm, and judged as B when the picking-up height exceeded 600 μm or the chip could not be picked up.

TABLE 1

| | Example 1 | Example 2 | Example 3 | Example 4 | Example 5 | Example 6 | Example 7 |
|---|---|---|---|---|---|---|---|
| Kind of film | A | B | C | D | E | F | G |
| Peel strength X between second pressure-sensitive adhesive layer and film for semiconductor back surface [N/20 mm] | 0.08 | 0.08 | 0.08 | 0.08 | 0.08 | 0.08 | 0.08 |
| Peel strength Y between first pressure-sensitive adhesive layer and second pressure-sensitive adhesive layer [N/20 mm] | 1.18 | 0.65 | 0.72 | 0.31 | 0.25 | 0.68 | 0.24 |
| Ratio of peel strength Y to peel strength X (Y/X) | 14.8 | 8.1 | 9.0 | 3.9 | 3.1 | 8.5 | 3.0 |

TABLE 1-continued

|  | Example 1 | Example 2 | Example 3 | Example 4 | Example 5 | Example 6 | Example 7 |
|---|---|---|---|---|---|---|---|
| Peel strength between first pressure-sensitive adhesive layer and SUS [N/20 mm] | 5.2 | 3.8 | 4.7 | 2.3 | 1.1 | 10.8 | 2.2 |
| Chip contamination | A | A | A | A | A | A | A |
| Picking-up property | A | A | A | A | A | A | A |

TABLE 2

|  | Example 8 | Example 9 | Comparative Example 1 | Comparative Example 2 | Comparative Example 3 | Comparative Example 4 | Comparative Example 5 |
|---|---|---|---|---|---|---|---|
| Kind of film | H | I | J | K | L | M | N |
| Peel strength X between second pressure-sensitive adhesive layer and film for semiconductor back surface [N/20 mm] | 0.015 | 0.12 | 0.66 | 0.008 | 0.08 | 0.08 | 0.08 |
| Peel strength Y between first pressure-sensitive adhesive layer and second pressure-sensitive adhesive layer [N/20 mm] | 0.69 | 6.77 | 4.88 | 5.34 | 0.09 | 0.18 | 0.09 |
| Ratio of peel strength Y to peel strength X (Y/X) | 46.0 | 56.4 | 7.4 | 667.5 | 1.1 | 2.3 | 1.1 |
| Peel strength between first pressure-sensitive adhesive layer and SUS [N/20 mm] | 5.2 | 5.2 | 5.2 | 5.2 | 0.2 | 0.9 | 0.1 |
| Chip contamination | A | A | B | C | A | A | A |
| Picking-up property | A | A | B | A | B | B | B |

(Results)

As seen from Tables 1 and 2, in the dicing tape-integrated film for semiconductor back surface where, as in Examples 1 to 9, the peel strength Y between the first pressure-sensitive adhesive layer and the second pressure-sensitive adhesive layer is larger than the peel strength X between the second pressure-sensitive adhesive layer and the film for semiconductor back surface, the peel strength X is from 0.01 to 0.2 N/20 mm, the peel strength Y is from 0.2 to 10 N/20 mm, and the ratio of peel strength Y to peel strength X is from 3 to 500, the dicing property is good, the chip contamination is suppressed, and the picking-up property is excellent. On the other hand, when the peel strength X exceeds the specified range as in Comparative Example 1, the picking-up property is impaired, and when the ratio above exceeds the specified range as in Comparative Example 2, the peel strength X is relatively decreased and the performance in terms of chip contamination is poor. Furthermore, in all of Comparative Examples 3 to 5 where the peel strength Y is less than the specified range and the ratio above is less than the specified range, separation between the base material and the first pressure-sensitive adhesive layer is generated and the picking-up property is impaired.

While the present invention has been described in detail and with reference to specific embodiments thereof, it will be apparent to one skilled in the art that various changes and modifications can be made therein without departing from the scope thereof.

This application is based on Japanese patent application No. 2010-170920 filed Jul. 29, 2010, the entire contents thereof being hereby incorporated by reference.

What is claimed is:

1. A method for producing a semiconductor device using a dicing tape-integrated film for semiconductor back surface, the method comprising:

attaching a non-circuit surface of a semiconductor wafer onto a film for semiconductor back surface in a dicing tape-integrated film for semiconductor back surface, wherein the dicing tape integrated film for semiconductor back surface comprises a base material layer, a first pressure-sensitive adhesive layer and a second pressure-sensitive adhesive layer stacked in this order, and a film for semiconductor back surface stacked on the second pressure-sensitive adhesive layer of the dicing tape, wherein a peel strength Y between the first pressure-sensitive adhesive layer and the second pressure-sensitive adhesive layer is larger than a peel strength X between the second pressure-sensitive adhesive layer and the film for semiconductor back surface, and wherein the peel strength X is from 0.01 to 0.2 N/20 mm, and the peel strength Y is from 0.2 to 10 N/20 mm, dicing the semiconductor wafer to form a semiconductor chip, separating the semiconductor chip together with the film for semiconductor back surface from the second pressure-sensitive adhesive layer of the dicing tape, and flip chip-connecting the semiconductor chip onto an adherend.

2. The method for producing a semiconductor device according to claim 1, wherein a ratio (Y/X) of the peel strength Y to the peel strength X is from 3 to 500.

3. The method for producing a semiconductor device according to claim 1, wherein the second pressure-sensitive adhesive layer has a thickness of 10 um or more.

4. The method for producing a semiconductor device according to claim 2, wherein the second pressure-sensitive adhesive layer has a thickness of 10 um or more.

5. The method for producing a semiconductor device according to claim 1, wherein the second pressure-sensitive adhesive layer is formed of an ultraviolet-curable pressure-sensitive adhesive.

6. The method for producing a semiconductor device according to claim 2, wherein the second pressure-sensitive adhesive layer is formed of an ultraviolet-curable pressure-sensitive adhesive.

7. The method for producing a semiconductor device according to claim 3, wherein the second pressure-sensitive adhesive layer is formed of an ultraviolet-curable pressure-sensitive adhesive.

8. The method for producing a semiconductor device according to claim 4, wherein the second pressure-sensitive adhesive layer is formed of an ultraviolet-curable pressure-sensitive adhesive.

* * * * *